US 6,477,089 B2

(12) United States Patent
Takeda et al.

(10) Patent No.: US 6,477,089 B2
(45) Date of Patent: Nov. 5, 2002

(54) NONVOLATILE SEMICONDUCTOR MEMORY CIRCUIT CAPABLE OF HIGH-SPEED DATA READING

(75) Inventors: Keiichiro Takeda, Tokyo; Teruhiro Harada, Kanagawa, both of (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/924,553

(22) Filed: Aug. 9, 2001

(65) Prior Publication Data

US 2002/0018374 A1 Feb. 14, 2002

(30) Foreign Application Priority Data

Aug. 10, 2000 (JP) ........................................ 2000-242163

(51) Int. Cl.⁷ .............................................. G11C 16/04
(52) U.S. Cl. ............................ 365/189.09; 365/185.16; 365/185.17
(58) Field of Search ..................... 365/189.09, 185.16, 365/185.17

(56) References Cited

U.S. PATENT DOCUMENTS

| | | | |
|---|---|---|---|
| 5,450,354 A | 9/1995 | Sawada et al. .............. 365/185 |
| 5,517,448 A | 5/1996 | Liu ........................ 365/185.11 |
| 5,748,538 A | 5/1998 | Lee et al. ................ 365/185.06 |
| 5,886,937 A | 3/1999 | Jang ............................ 365/203 |
| 6,044,033 A | * | 3/2000 | Jang ....................... 365/189.09 |
| 6,147,912 A | * | 11/2000 | Kitazawa ................ 365/189.01 |
| 6,278,649 B1 | * | 8/2001 | Lee et al. ................... 365/104 |
| 6,324,109 B1 | * | 11/2001 | Inoue ......................... 365/203 |

FOREIGN PATENT DOCUMENTS

| | | |
|---|---|---|
| JP | 61-181000 | 8/1986 |
| JP | 2-210694 | 8/1990 |
| JP | 6-318683 | 11/1994 |
| JP | 61-180999 | 8/1996 |

* cited by examiner

Primary Examiner—Richard Elms
Assistant Examiner—Tuan T. Nguyen
(74) Attorney, Agent, or Firm—Volentine Francos, PLLC

(57) ABSTRACT

A nonvolatile semiconductor memory comprises a cell bias circuit supplying a first voltage, a memory cell array having memory cell transistors, word lines, drain lines disposed perpendicular to the word lines and source lines disposed perpendicular to the word lines. the nonvolatile semiconductor memory further comprises source line equalizing transistors connected between the cell bias circuit and the source lines, respectively, the source line equalizing transistors turning on during a stand by mode, drain line equalizing transistors connected between the cell bias circuit and the drain lines, respectively, the drain line equalizing transistors turning on during the stand by mode, bit lines, main source lines, source line selecting transistors connected between the main source lines and the source lines, respectively, the source line selecting transistors turning off during the stand by mode, drain line selecting transistors connected between the bit lines and the drain lines, respectively, the drain line selecting transistors turning off during the stand by mode and a detecting circuit connected to said bit lines for supplying the first voltage to the bit lines for detecting data stored in the memory cells.

12 Claims, 16 Drawing Sheets

NONVOLATILE SEMICONDUCTOR MEMORY CIRCUIT CAPABLE OF HIGH-SPEED DATA READING

BACKGROUND OF THE INVENTION

The present invention relates to a nonvolatile semiconductor memory and, more particularly, to a nonvolatile semiconductor memory circuit capable of reading data at high speed.

Japanese Unexamined Patent Publication No. 61-180999. and Japanese Unexamined Patent Publication No. 61-181000 have disclosed technologies related to erasable programmable read only memories (EPROM's) exemplifying conventional nonvolatile semiconductor memories.

As described in the aforesaid literature, EPROM's are classified into a type having NOR memory cells and another type having NAND memory cells. The NOR memory cells are advantageous if the speed for reading data is important; however, the NOR memory cells is disadvantageous in that it requires a larger layout area, as compared with the NAND memory cells. For this reason, there are cases where an X-cell system as an extension of a NOR memory cell layout system is used in order to reduce the layout area of memory cells.

According to the X cell system, each source of a pair of memory cells that is selected on the basis of the same row address is connected to a column line. The drains of the pair of memory cells are respectively connected to the two it lines adjacent to the column line. The paired memory cells are simultaneously selected, requiring at least two data buses.

The EPROM employing the X cell system has a memory cell block wherein memory cells for storing data are disposed in a matrix pattern. The memory cell block is provided with a plurality of bit lines and column lines that are alternately disposed, and a plurality of row lines that are orthogonal thereto. A memory cell composed of a MOS transistor is provided between each bit line and each column line.

A row address decoder for selecting one from among the plural row lines is connected to the plural row lines. One end of the bit lines and the column lines is provided with a bias circuit for setting the potentials thereof at predetermined levels. Furthermore, a column switch that is controlled by the column address decoder and selects one set of either the bit lines or the column lines is connected to the other end of the bit lines and the column lines. The bit lines and the data buses are connected via the column switch. A detecting circuit for outputting a voltage based on a current passing through a bit line is connected to each data bus.

According to the conventional EPROM, however, a bit line that has not been selected by the column address decoder (non-selected bit line) is charged to an output voltage level of a bias circuit, i.e., a cell bias voltage level, by a memory cell other than a selected memory cell belonging to the same row address as that of the memory cell which has been selected (a selected memory cell). As a result, as shown in FIG. 16, the voltage of a selected bit line changes from the cell bias voltage to a sense voltage of the detecting circuit over a certain time after a column address is changed.

In addition, the drain line of a memory cell disconnected from the bias circuit turns into a so-called floating node. Therefore, a bit line does not necessarily retain a cell bias voltage immediately after it is selected, because of a non-selected cell current, junction leakage, or the like.

Thus, according to the conventional EPROM, it has been necessary to wait until the drain line of a memory cell connected to the bias circuit settles to the cell bias voltage, and the voltage of a bit line settles to the sense voltage of the detecting circuit, as shown in FIG. 16, before the bit line is changed to read data. This waiting time has been partly responsible for interfering with achieving higher speed in reading data.

SUMMARY OF THE INVENTION

The present invention has been made with a view toward solving the problem described above, and it is an object of the present invention to provide a nonvolatile semiconductor memory capable of reading data at higher speed.

A nonvolatile semiconductor memory of the present invention comprises a cell bias circuit supplying a first voltage, a memory cell array having memory cell transistors, word lines, drain lines disposed perpendicular to the word lines and source lines disposed perpendicular to the word lines. The nonvolatile semiconductor memory further comprises source line equalizing transistors connected between the cell bias circuit and the source lines, respectively, the source line equalizing transistors turning on during a stand by mode, drain line equalizing transistors connected between the cell bias circuit and the drain lines, respectively,. the drain line equalizing transistors turning on during the stand by mode, bit lines, main source lines, source line selecting transistors connected between the main source lines and the source lines, respectively, the source line selecting transistors turning off during the stand by mode, drain line selecting transistors connected between the bit lines and the drain lines, respectively, the drain line selecting transistors turning off during the stand by mode and a detecting circuit connected to said bit lines for supplying the first voltage to the bit lines for detecting data stored in the memory cells.

DESCRIPTION OF THE PREFERRED EMBODIMENTS

Figure 1:
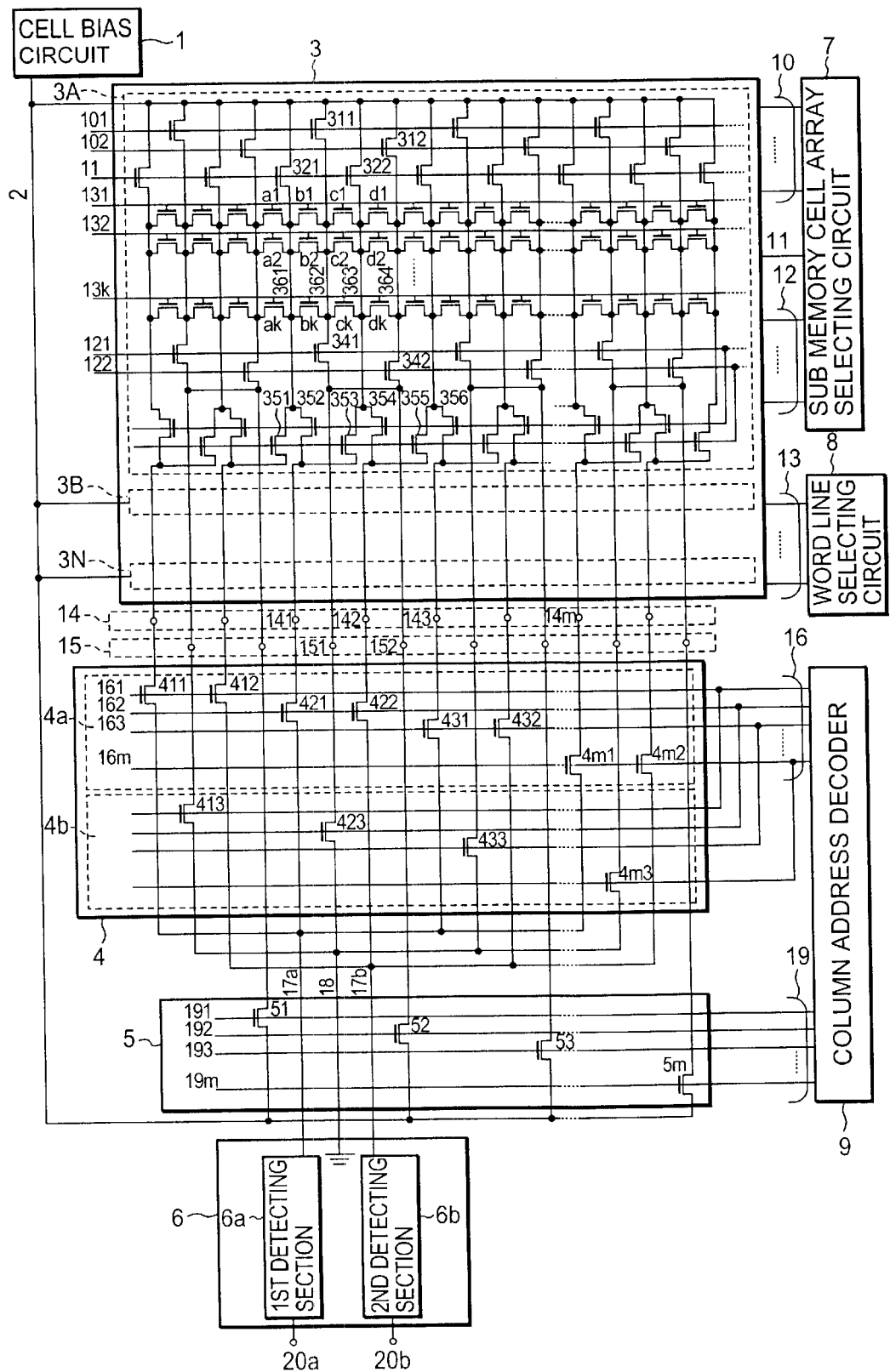
FIG. 1 is a circuit diagram showing the configuration of a nonvolatile semiconductor memory according to a first embodiment of the present invention.

Preferred embodiments of a nonvolatile semiconductor memory in accordance with the present invention will now be described in detail with reference to the accompanying drawings. In the following descriptions and the accompanying drawings, the components having substantially the same functions and configurations will be assigned the same reference numerals, and the same descriptions will not be repeated.

First Embodiment

Figure 2:
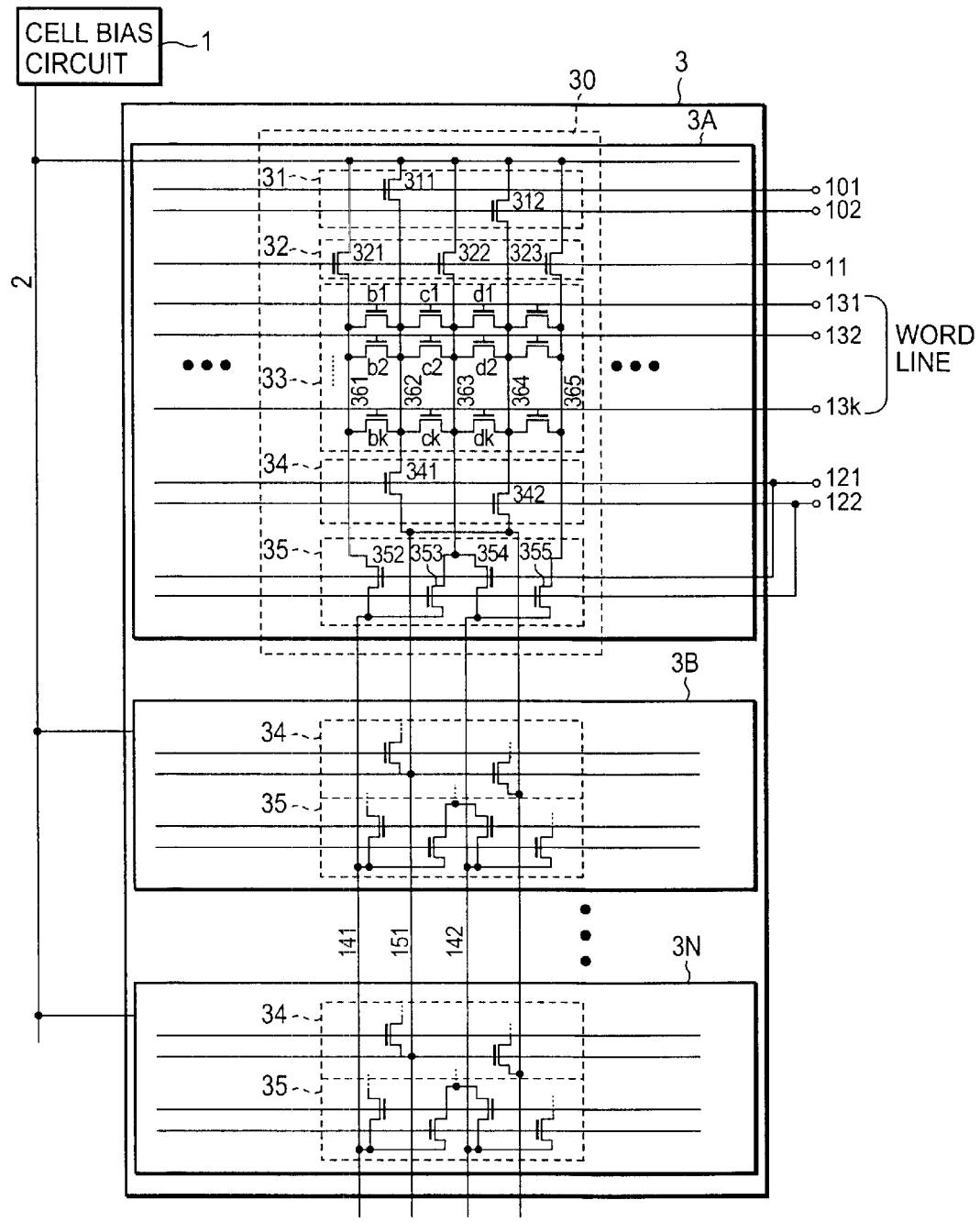
FIG. 2 is a circuit diagram showing the configuration of a sub memory cell array provided in the nonvolatile semiconductor memory shown in FIG. 1.
Figure 3:
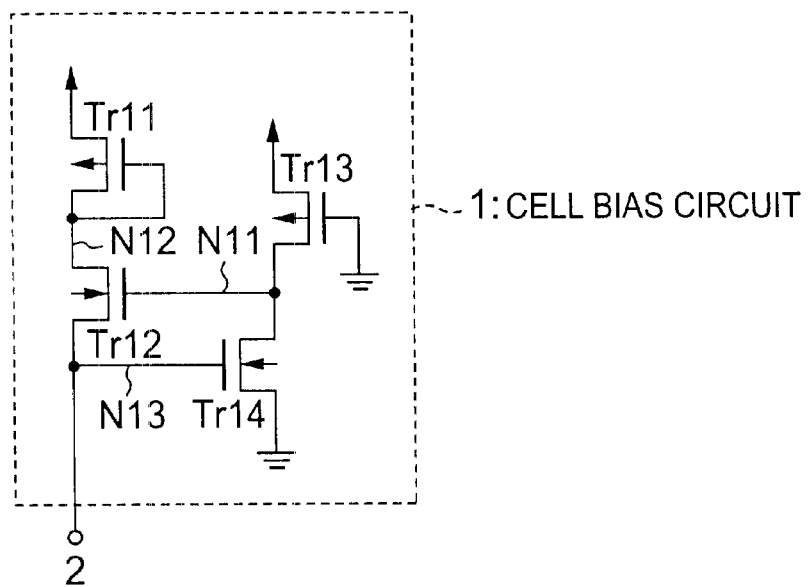
FIG. 3 is a circuit diagram showing the configurations of a cell bias circuit and a detecting circuit provided in the nonvolatile semiconductor memory shown in FIG. 1.
Figure 3:
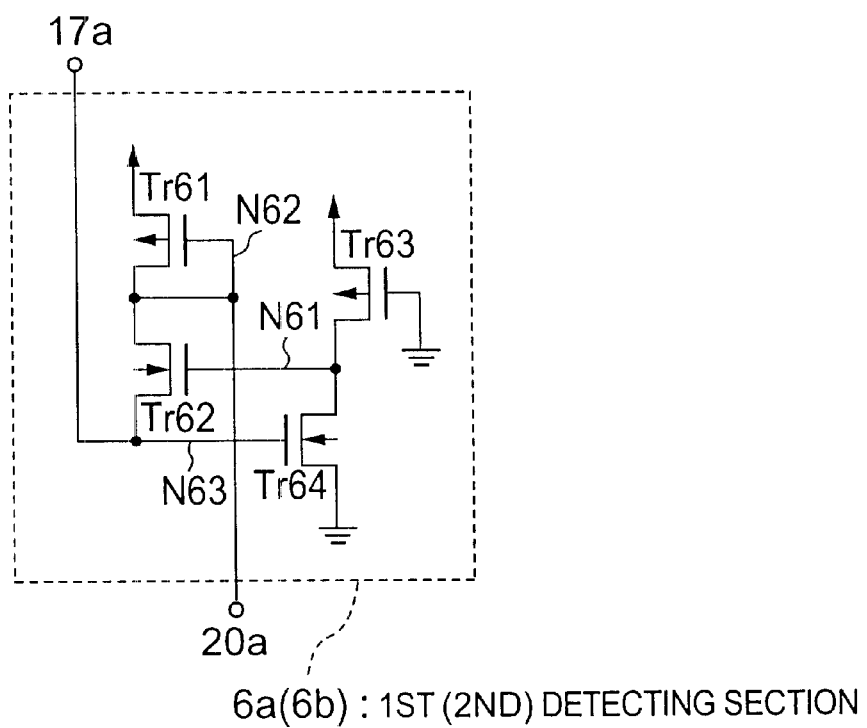

The configuration of a nonvolatile semiconductor memory according to a first embodiment of the present invention is shown in FIG. 1, FIG. 2, and FIG. 3.

The nonvolatile semiconductor memory according to a first embodiment includes a cell bias circuit 1 (constant voltage output section), a memory cell array 3, a column switch group 4, a non-selected source line equalizing transistor group 5, a detecting circuit 6, a sub memory cell array selecting circuit 7, a word line selecting circuit 8, and a column address decoder 9.

The cell bias circuit 1 supplies bias voltages to the drains of the memory cells making up the memory cell array 3.

The memory cell array 3 is connected to the cell bias circuit 1 via a bias voltage supply line 2, connected to the sub memory cell array selecting circuit 7 via a source equalizing selection line group 10, a drain equalizing selection line group 11, and a sub memory cell array selection line group 12, and further connected to the word line selecting circuit 8 via a word line group 13. The memory cell array 3 is connected to a main source line group 15 and a bit line group 14.

The memory cell array 3 is constructed by NOR memory cells a1, a2, a3, and so on that are arranged in a matrix pattern, and divided into sub memory cell arrays 3A, 3B, . . . 3N for each predetermined number (k) of word lines 131 to 13k. The sub memory cell arrays 3A, 3B, . . . 3N all share substantially the same configuration. As shown in FIG. 2, the sub memory cell arrays 3A, 3B, . . . 3N are provided with a plurality of basic memory cell array blocks 30.

Each of the basic memory cell array blocks 30 is configured as described below.

In a memory cell block 33, the gates of the memory cells a1, b1, c1, and so on are connected to the word line 131. Similarly, the gates of the memory cells a2, b3, c2, and so on are connected to a word line 132, and the gates of memory cells ak, bk, ck, and so on are connected to a word line 13k.

The drains and the sources of the memory cells b1, b2, and so on are respectively connected to a drain line 361 and a source line 362. Similarly, the drains and sources of the memory cells c1, c2, c3, and so on are individually connected to a drain line 363 and a source line 362, and the drains and sources of memory cells d1, d2, d3, and so on are connected to the drain line 363 and a source line 364.

The sources of n-channel source line equalizing transistors 311 and 312 making up the source line equalizing transistor group 31 (a first source line selector) are respectively connected to source lines 362 and 364, the gates thereof are respectively connected to source equalizing selection lines 110 and 102, and the drains thereof are connected to the bias voltage supply line 2 serving as the output voltage line of the cell bias circuit 1.

The sources of n-channel drain line equalizing transistors 321, 322, and 323 making up the drain line equalizing transistor group 32. (a second drain line selector) are respectively connected to drain lines 361, 363, and 365, the gates thereof are connected to a drain equalizing selection line 11, and the drains thereof are connected to the bias voltage supply line 2. The transistors 321, 322, 323, and so on making up the drain line equalizing transistor group 32 are formed to have sufficiently small conductance.

The drains of n-channel source selecting transistors 341 and 342 making up a source selecting transistor group 34 (a second source line selector) are respectively connected to source lines 362 and 364, the gates thereof are connected to sub memory cell array selection lines 121 and 122, and the sources thereof are connected to a main source line 151.

The drains of n-channel drain selecting transistors 352, 353, 354, and 355 making up a drain selecting transistor group 35 (a second drain line selector) are respectively connected to drain lines 361, 362, 363, and 364, the gates thereof are respectively connected to sub memory cell array selection lines 121, 122, 121, and 122, and the sources thereof are connected to bit lines 141, 141, 142, and 142.

The main source line 151 and the bit lines 141 and 142 are shared in the sub memory arrays 3A, 3B, . . . , 3N.

The number of the basic memory cell array blocks 30 disposed at the sub memory cell arrays 3A, 3B, . . . , 3N is adjusted according to the number of the bit lines formed in the memory cell array 3. It is also possible to make the drain line equalizing transistor 321 and the drain line 361 belonging to a certain basic memory cell array block interchangeable with the drain line equalizing transistor 323 and the drain line 365 belonging to an adjacent basic memory array block.

A column switch group 4 is constructed by a bit line column switch group 4a (a bit line selector) composed of n-channel transistors 411, 412, . . . , 4m1, and 4m2 having their drains connected to the bit line group 14, and a source line column switch group 4b composed of n-channel transistors 413 through 4m3 having their drains connected to the main source line group 15.

The gates of transistors 411, 412, . . . , 4m1, and 4m2 belonging to the bit line column switch group 4a and the gates of the transistors 413 through 4m3 belonging to the source line column switch group 4b are connected to column selection lines 161 through 16m making up a column selection line group 16.

The sources of transistors 411, 421, . . . , and 4m1 belonging to the bit line column switch group 4a are connected, via a node 17a (a first node), to a first detecting section 6a constituting the detecting circuit 6. The sources of transistors 412, 422, . . . , and 4m2 are connected, via a node 17b (a second node), to a second detecting section 6b constituting the detecting circuit 6.

The sources of transistors 413 through 4m3 belonging to the source line column switch group 4b are connected to a ground line.

The sources of. n-channel transistors 51, 52, . . . , 5m making up the non-selected source line equalizing transistor group 5 are connected to a main source line constituting the main source line group 15, the gates thereof are connected to non-selected column selection lines 191, 192, . . . , 19m making up a non-selected column selection line group 19, and the drains thereof are connected to the bias voltage supply line 2.

The sub memory cell array selecting circuit 7 is a logic circuit that asserts one of the source equalizing selection lines 101 and 102 making up the source equalizing selection line group 10, and one of the sub memory cell array selection lines 121 and 122 making up the drain equalizing selection line 11 and the sub memory cell array selection line group 12 according to a received address signal.

The word line selecting circuit 8 is a logic circuit that selects and asserts one word line from among the word lines 131, 132, . . . 13k constituting the word line group 13, according to a received address signal.

The column address decoder 9 is a logic circuit that selects one column selection line from among the column selection lines 161 through 16m making up the column selection line group 16, and also selects one non-selected column selection line from among non-selected column selection lines 191, 192, . . . , 19m making up a non-selected column selection line group 19, and asserts the selected column selection line and the selected non-selected column selection line in response to a received address signal.

The circuit configurations of the cell bias circuit 1 and the detecting circuit 6 will be described in conjunction with FIG. 3.

The cell bias circuit 1 is constructed by p-channel transistors Tr11 and Tr13, and n-channel transistors Tr12 and Tr14.

The source of the transistor Tr11 is connected to a power line, and the drain and the gate thereof are connected to a node N12. The drain of the transistor Tr12 is connected to a node N12, the gate thereof is connected to a node N11, and the source thereof is connected to a node N13.

The source of the transistor Tr13 is connected to a power line, the gate thereof is connected to a ground line, and the drain is connected to a node N11. The drain of the transistor Tr14 is connected to a node N11, the gate thereof is connected to a node N13, and the source thereof is connected to a ground line.

The node N13 is an output node of the cell bias circuit 1, and connected to the bias voltage supply line 2.

As mentioned above, the detecting circuit 6 is constructed by the first detecting section 6a and the second detecting section 6b. The first detecting section 6a and the second detecting section 6b share substantially the same circuit configuration, so that the circuit configuration of only the first detecting circuit 6a will be described.

The first detecting section 6a is constructed by p-channel transistors Tr61 and Tr63, and n-channel transistors Tr62 and Tr64.

The source of the transistor Tr61 is connected to a power line, and the drain and the gate thereof are connected to a node N62. The drain of the transistor Tr62 is connected to a node N62, the gate thereof is connected to a node N61, and the source thereof is connected to a node N63.

The source of the transistor Tr63 is connected to a power line, the gate thereof is connected to a ground line, and the drain thereof is connected to a node N61. The drain of the transistor Tr64 is connected to the node N61, the gate thereof is connected to a node N63, and the source thereof is connected to a ground line.

The node N63 is connected to a node 17a, and the node N62 is connected to an output node 20a (a first node) of the first detecting section 6a. The first detecting section 6a generates a voltage based on a change in the current flowing in via a node 17a from the bit line 141, and outputs the generated voltage from the output node 20a.

The output node 20a of the first detecting section 6a and an output node 20b (a second node) of the second detecting section 6b are connected to a circuit (e.g. an amplifier circuit) in the following stage.

The operation of the nonvolatile semiconductor memory according to the first embodiment constructed as set forth above will now be described.

The cell bias circuit 1, which is a constant-voltage source, outputs a bias voltage to be applied to the drain of a memory cell to the bias voltage supply line 2.

The first detecting section 6a and the second detecting section 6b belonging to the detecting circuit 6 have a circuit configuration similar to that of the cell bias circuit 1, and adjust the nodes 17a and 17b to the same potential as that of the bias voltage supply line 2.

If the sub memory cell array 3A is not selected (during a stand-by situation), then all the source lines 362, 364, and so on, and the drain lines 361, 363, and so on that belong to the sub memory cell array 3A are equalized. This causes the sub memory cell array selecting circuit 7 to set the source equalizing selection lines 101 and 102 connected to the sub memory cell array 3A among the source equalizing selection line group 10 at an H level, and the drain equalizing selection line 11 at the H level. Thus, all source line equalizing transistors 311, 312, and so on and all drain line equalizing transistors 321, 322, 323 and so on that belong to the sub memory cell array 3A are all turned ON, that is, set to a conducting state.

Furthermore, the sub memory cell array selecting circuit 7 isolates the drain lines 361, 363, and so on of the sub memory cell array 3A from the bit line group 14, and also isolates the source lines 362, 364, and so on from the main source line group 15. This causes the sub memory cell array selection lines 121 and 122 connected to the sub memory cell array 3A in the sub memory cell array selection line group 12 to be set at an L level, so that all the source selection transistors 341, 342, and so on, and all the drain selection transistors 351, 352, and so on that belong to the sub memory cell array 3A are turned OFF, that is, set to a non-conducting state.

The operation of the nonvolatile semiconductor memory according to the first embodiment when stored data is read from memory cells b2 and c2 that belong to the sub memory cell array 3A will now be described.

The word line selecting circuit 8 sets the word line 132 connected to the gates of the memory cells b2 and c2 to the H level, while it sets the word lines 131, 133, . . . 13k other than the word line 132 to the L level.

At the same time, the sub memory cell array selecting circuit 7 sets the sub memory cell array selection line 121 to the H level to set the drain selecting transistors 352 and 354 and the source selecting transistor 341 to an ON state, that is, the conducting state. This causes the drain lines 361 and 363 connected to the drains of the memory cells b2 and c2 to be connected to the bit lines 141 and 142. Thus, the source line 362 commonly connected to the sources of the memory cells b2 and c2 and the main source line 151 are connected.

Furthermore, the sub memory cell array selecting circuit 7 sets the source equalizing selection-line 101 at the L level thereby to set the source line equalizing transistor 311 to the OFF state, that is, the non-conducting state so as not to apply an equalizing voltage to the source line 362. The sub memory cell array selecting circuit 7 also sets the source equalizing selection line 102 at the H level to equalize the source line to which the non-selected memory cells other than the memory cells b2 and c2 are connected, and sets the drain equalizing selection line 11 at the H level to equalize the drain line to which the non-selected memory cells are connected.

The conductance of the drain line equalizing transistors 321 and 322 connected to the drain line is set to a value that will not affect a data reading operation when the transistors are turned ON. Specifically, the drain line equalizing transistors 321 and 322 are formed to have conductance that is sufficiently small so as not to allow direct current to pass.

The bit line 141 is connected to the drain of the non-selected memory cell a2 adjacent to a selected memory cell b2 via the drain line 361. The bit line 142 is connected to the drain of a non-selected memory cell d2 adjacent to a selected memory cell c2 via the drain line 363. The drain lines 361 and 362 are equalized, so that they do not interfere with the operation performed by the detecting circuit 6 to read data from the selected memory cells b2 and c2.

The column address decoder 9 sets a column selection line 162 at the H level to turn ON the transistor 421 belonging to the bit line column switch group 4a and a transistor 423 belonging to the source line column switch group 4b. This causes the bit line 141 and the node 17a to be connected, the bit line 142 and the node 17b to be connected, and the main source line 151 to be connected to a node 18 connected to the ground line.

At the same time, the column address decoder 9 sets the column selection lines 161, 163, . . . , 16m other than the column selection line 162 at the L level to turn OFF the transistors other than the transistor 421 that belong to the bit line column switch group 4a, and the transistors other than the transistor 423 that belong to the source line column switch group 4b. This isolates the non-selected bit lines other than the selected bit lines 141 and 142, and the non-selected main source lines other than the selected main source line 151 from the detecting circuit 6.

Furthermore, the column address decoder 9 sets non-selected column selection lines 191, 193, . . . , 19m at the H level to set the transistors 51, 53, . . . , 5m constituting the non-selected source line equalizing transistor group 5 to the ON state, that is, the conducting state. Thus, the source line that is connected to the non-selected memory cell and has been isolated from the bias voltage supply line 2 by the source line equalizing transistor controlled by the source equalizing selection line 101 is subjected to the bias voltage output from the cell bias circuit 1 so as to be equalized. The non-selected column selection line 192 is set at the L level and the transistor 52 is set to the OFF state or the non-conducting state to prevent the bias voltage supply line 2 and the selected main source line 151 from being connected.

When the word line 132 is set at the H level and the memory cell b2 is set to the ON state, causing the node 17a and the node 18 connected to the ground line to conduct, a current path from the node 17a to the node 18 is formed, and a voltage corresponding to data"1" appears at the node 17a.

If the memory cell b2 is in the OFF state even when the word line 132 switches to the H level, then the current path from the node 17a to the node 18 is not formed, and the node 17a maintains a voltage corresponding to data "0", i.e., the equalizing voltage. In this embodiment, the voltage corresponding to data"1" appears at the node when the memory cell is in the ON state, while the voltage corresponding to data "0" appears at the node when the memory cell is in the OFF state; however, this relationship may alternatively be reversed.

The detecting circuit 6 controls the voltage of a bit line in a negative feedback mode in response to a change in the voltage of the bit line caused by a change in the impedance of the current path. To be more specific, the first detecting section 6a acts to increase the amount of current passing through the current path in order to set the node 17a back to an original voltage if the impedance of the current path decreases, causing the voltage of the node 17a to drop. At this time, the impedance of the transistor Tr62 provided in the first detecting section 6a decreases, so that the voltage of the output node 20a drops. Conversely, if the impedance of the current path increases and the voltage of the node 17a increases, then the first detecting section 6a acts to decrease the amount of current passing through the current path in order to set the node 17a back to the original voltage. At this time, the impedance of the transistor Tr62 provided in the first detecting section 6a increases, causing the voltage of the output node 20a to increase.

Figure 4:
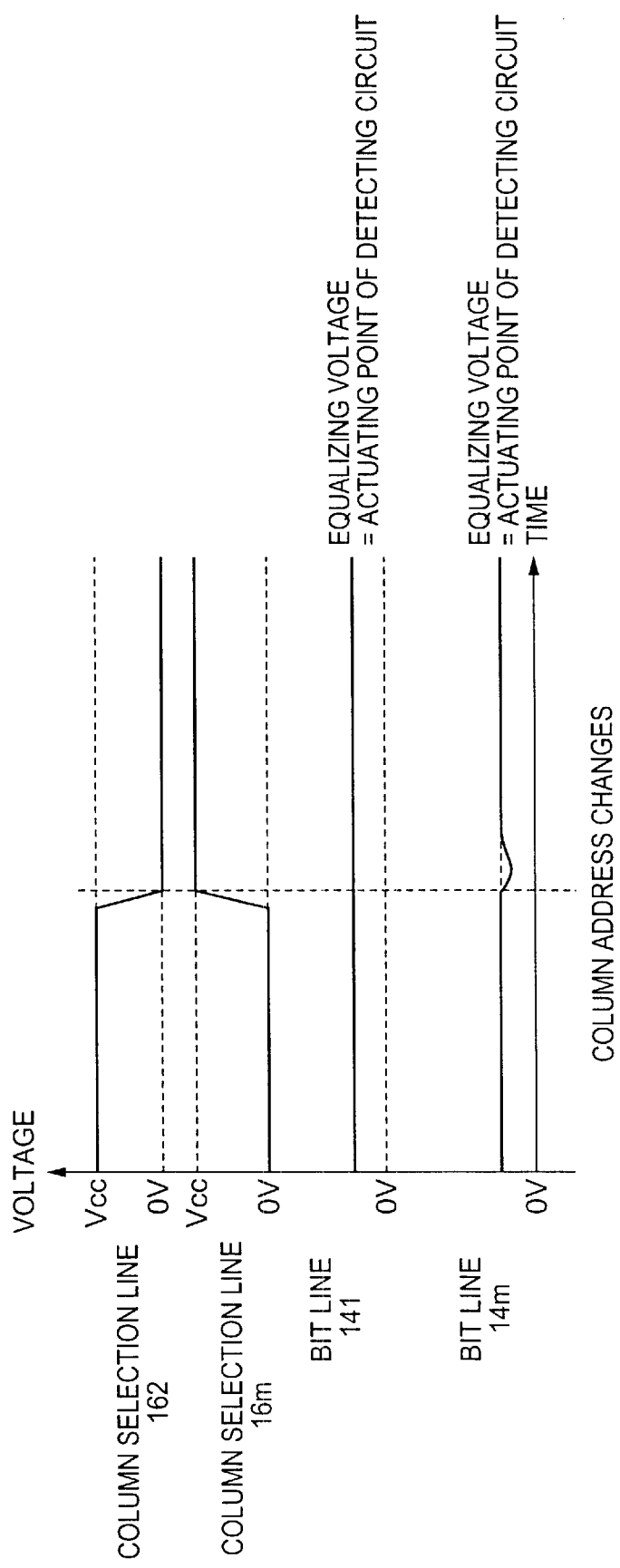
FIG. 4 is a waveform diagram showing changes in voltage during a data reading operation of bit lines provided in the nonvolatile semiconductor memory shown in FIG. 1.

As described above, according to the nonvolatile semiconductor memory in accordance with the first embodiment, the drain lines and the source lines connected to non-selected memory cells are equalized to the input voltage (sense voltage) of the detecting circuit 6. Furthermore, the detecting circuit 6 outputs a voltage equal to the equalizing voltage to a bit line; therefore, the change in the voltage of the main source line caused by switching from a selected state to a non-selected state or vice versa, that is, the charging or discharging time of charges accumulated in the main source line, can be controlled to a minimum. Moreover, the charging or discharging of bit lines that are unnecessary for reading data can be prevented, as shown in FIG. 4, thus permitting faster reading of data to be achieved.

Second Embodiment

Figure 5:
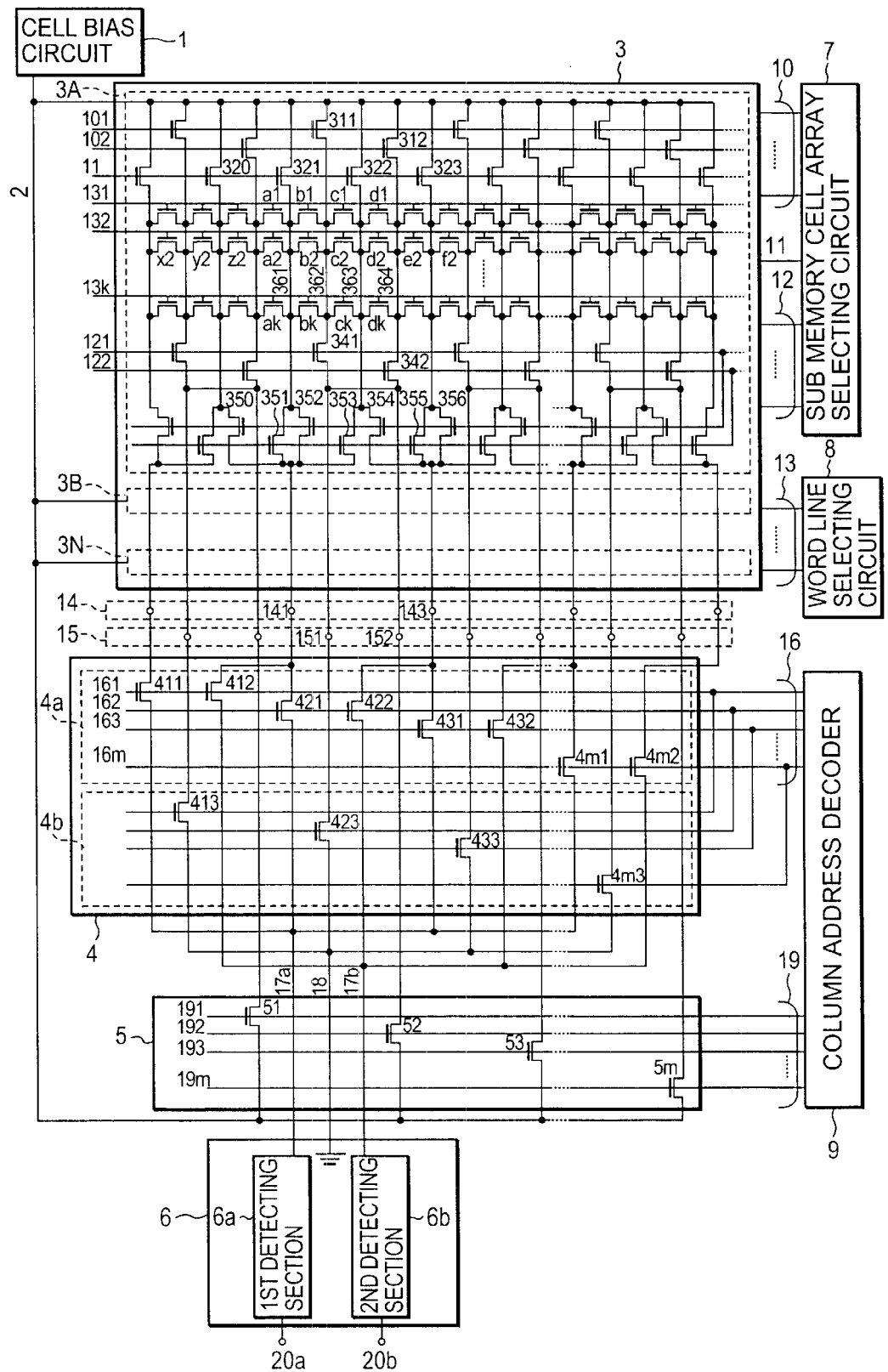
FIG. 5 is a circuit diagram showing the configuration of a nonvolatile semiconductor memory according to a second embodiment of the present invention.

The configuration of a nonvolatile semiconductor memory according to a second embodiment of the present invention is shown in FIG. 5.

The nonvolatile semiconductor memory according to the second embodiment is different from the nonvolatile semiconductor memory according to the first embodiment in that it features commonality of two adjoining bit lines. The commonality of bit lines applies to the bit lines connected to transistors 411, 412, ..., 4m1, and 4m2 having their gates connected to different column selection lines 161 through 16m. For instance, in the nonvolatile semiconductor memory according to the first embodiment, the bit line 142 and the bit line 143 are connected to the transistors 422 and 431, respectively, that belong to the bit line column switch group 4a. The gates of the transistor 422 and the transistor 431 are connected to different column selection lines 162 and 163. Hence, the commonality applies to the bit line 142 and the bit line 143 in the nonvolatile semiconductor memory according to the second embodiment.

The operation of the nonvolatile semiconductor memory according to the second embodiment will now be described. The description will be given of the operation for reading stored data from memory cells b2 and c2 provided in a sub memory cell array 3A.

A word line selecting circuit 8 sets a word line 132 connected to the gates of memory cells b2 and c2 at the H level, while it sets the word lines 131, 133, ..., 13k other than the word line 132 at the L level.

At the same time, a sub memory cell array selection circuit 7 sets a sub memory cell array selection line 121 at the H level to cause drain selecting transistors 352, 354 and a source selecting transistor 341 to be set to an ON state or a conducting state. This causes drain lines 361 and 363 connected to the drains of the memory cells b2 and c2 to be connected to bit lines 141 and 143. Thus, a source line 362 commonly connected to the sources of the memory cells b2 and c2 and a main source line 151 are connected.

Furthermore, the sub memory cell array selecting circuit 7 sets the source equalizing selection line 101 at the L level thereby to set a source line equalizing transistor 311 to the OFF state or the non-conducting state so as not to apply an equalizing voltage to the source line 362. The sub memory cell array selecting circuit 7 also sets a source equalizing selection line 102 at the H level to equalize the source line to which the non-selected memory cells other than the memory cells b2 and c2 are connected, and sets a drain equalizing selection line 11 at the H level to equalize the drain line to which the non-selected memory cells are connected.

At this time, drain line equalizing transistors 320, 321, 322, 323, and so on, and drain selecting transistors 350, 352, 354, and so on that are connected to the drain line are in the ON state or the conducting state. The conductance of the drain line equalizing transistors 320 and 321 is set to a value that will not affect the operation for reading data from the bit line 141. Similarly, the conductance of the drain line equalizing transistors 322 and 323 is set to a value that will not affect the operation for reading data from the bit line 143. Specifically, the drain line equalizing transistors 320, 321, 322, 323, and so on are formed to have conductance that is sufficiently small so as not to allow direct current to pass.

Drain selecting transistors 350, 352, 354, and 356 are turned ON; therefore, the bit line 141 is connected to a drain line connected to the drains of non-selected memory cells x2, y2, and z2, and the bit line 143 is connected to a drain line connected to the drains of non-selected memory cells d2, e2, and f2. All the drain lines, however, are subjected to the bias voltage output from a cell bias circuit 1, so that they do not affect the bit lines 141 and 143 to which a voltage of the same level as that of the bias voltage is applied from a detecting circuit 6.

As set forth above, the nonvolatile semiconductor memory according to the second embodiment has a reduced number of bit lines than in the nonvolatile semiconductor memory according to the first embodiment. Hence, even if the line pitch of bit lines is larger than the arranging pitch of memory cells, the same advantages as those of the nonvolatile semiconductor memory according to the first embodiment can be obtained without increasing the area of a memory cell array.

Moreover, the extra space obtained by the commonality of bit lines can be assigned to another circuit. In addition, the line resistance of bit lines and the capacitance generated between bit lines can be also reduced.

Third Embodiment

A nonvolatile semiconductor memory according to a third embodiment is different from the nonvolatile semiconductor memories according to the first and second embodiments in that the first detecting section 6a and the second detecting section 6b making up the detecting circuit 6 have been replaced by a first detecting section 76a and a second detecting section 76b.

Figure 6:
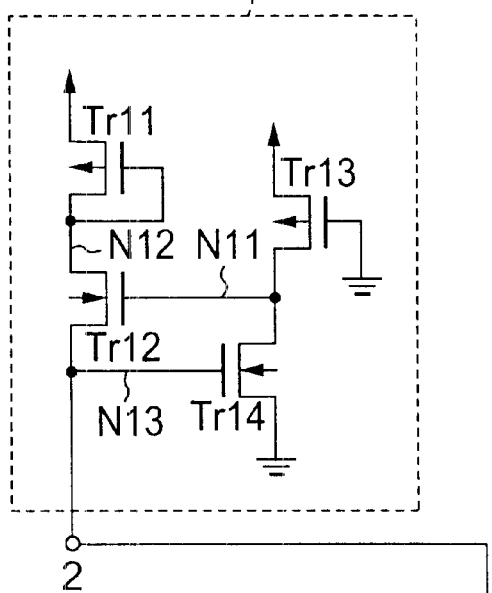
FIG. 6 is a circuit diagram showing the configurations of a cell bias circuit and a detecting circuit provided in the nonvolatile semiconductor memory according to a third embodiment of the present invention.
Figure 6:
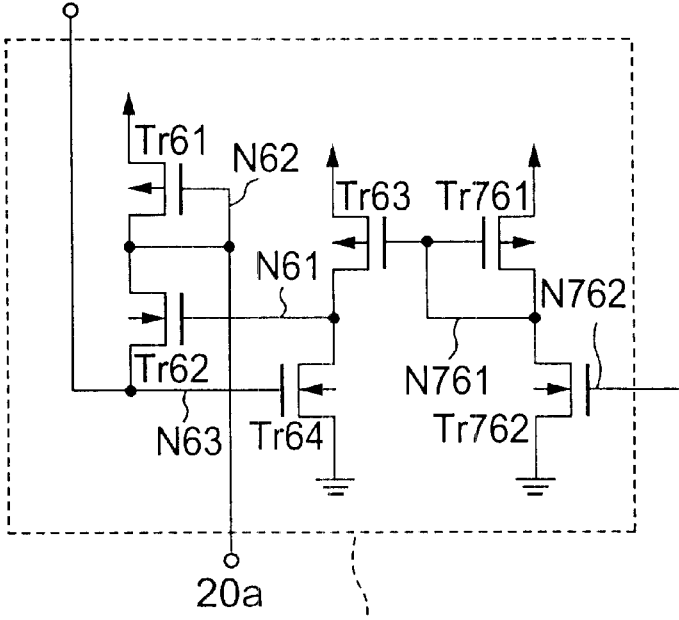

The first detecting section 76a and the second detecting section 76b share substantially the same circuit configuration, so that the circuit configuration of only the first detecting section 76a will be described in conjunction with FIG. 6. In FIG. 6, a cell bias circuit 1 connected to the first detecting section 76a is shown for reference purposes.

The cell bias circuit 1 is constructed by p-channel transistors Tr11 and Tr13 and n-channel transistors Tr12 and Tr14.

The source of a transistor Tr11 is connected to a power line, and the drain and the gate thereof are connected to a node N12. The drain of the transistor Tr12 is connected to the node N12, the gate thereof is connected to a node N11, and the source thereof is connected to a node N13.

The source of the transistor Tr13 is connected to a power line, the gate thereof is connected to a ground line, and the drain thereof is connected to the node N11. The drain of the transistor Tr14 is connected to the node N11, the gate thereof is connected to the node N13, and the source thereof is connected to a ground line.

The node N13 is an output node of the cell bias circuit 1, and connected to a bias voltage supply line 2.

The first detecting section 76a is constructed by p-channel transistors Tr61, Tr63, and Tr761, and n-channel transistors Tr62, Tr64, and Tr762.

The source of the transistor Tr61 is connected to a power line, and the drain and the gate thereof are connected to a node N62. The drain of the transistor Tr62 is connected to the node N62, the gate thereof is connected to a node N61, and the source thereof is connected to a node N63.

The source of the transistor Tr63 is connected to a power line, the gate thereof is connected to a node N761, and the drain thereof is connected to the node N61. The drain of the transistor Tr64 is connected to the node N61, the gate thereof is connected to the node N63, and the source thereof is connected to a ground line.

The source of the transistor Tr761 is connected to a power line, and the drain and the gate thereof are connected to a node N761. The drain of the transistor Tr762 is connected to the node N761, the gate thereof is connected to a node N762, and the source thereof is connected to a ground line.

The node N63 is connected to a node 17a, and the node N62 is connected to an output node 20a of the first detecting section 6a. The node N762 is connected to a bias voltage supply line 2.

The operation of a nonvolatile semiconductor memory according to the third embodiment configured as set forth above will be described, mainly focusing on the operations of a detecting circuit, namely, the first detecting section 76a, and a cell bias circuit 1.

The first detecting section 76a and the second detecting section 76b are provided with current mirror circuits, each of which is constructed by transistors Tr63, Tr64, Tr761, and Tr762. The bias voltage output from the cell bias circuit 1 to the bias voltage supply line 2 provides the reference voltage of the current mirror circuit.

The bias voltage output to the bias voltage supply line 2 is adjusted to approximately 1 V, so that the transistors Tr63, Tr64, Tr761, and Tr762 making up the current mirror circuit are in a saturated state, and the current mirror circuit has a large voltage amplification factor.

For example, if the voltage at the node 17a drops below the reference voltage (bias voltage) of the current mirror circuit, then the conductance of the transistor Tr64 reduces accordingly. On the other hand, the transistor Tr63 provides a constant current based on the reference voltage (bias voltage), so that the potential at the node N61 rapidly rises. The transistor Tr62 rapidly increases the conductance in response to the rise in the potential at the node N61. Charges are supplied to the node 17a via the transistors Tr61 and Tr62. This causes the potential at the node 17a to be set back to the level equal to the level of the output voltage of the cell bias circuit 1.

Conversely, if the voltage at the node 17a rises above the reference voltage (bias voltage) of the current mirror circuit provided in the first detecting section 76a, then a rise in the voltage at the node 17a will be controlled to a minimum.

To form a plurality of transistors having uniform characteristics, the transistors are preferably disposed in adjacent regions. By forming the transistor Tr761 and the transistor Tr762 inside the first detecting section 76a and constructing the current mirror circuit together with the transistors Tr63 and Tr64, it is possible to absorb the variations in threshold voltage Vt of other transistors by the current mirror circuit composed of the transistors having the uniform characteristics. Thus, the voltages at the node 17a and the node 17b coincide with the bias voltage output from the cell bias circuit 1.

Thus, according to the nonvolatile semiconductor memory according to the third embodiment is able to minimize the variations in the potentials of bit lines, and also to secure the margin for the finish variations of transistors that pose a serious problem as the circuits become finer. In addition, since the changes in the input voltage of the detecting circuit 6 are suppressed, charging or discharging in parasitic capacitors is reduced, permitting faster data reading to be accomplished.

Fourth Embodiment

Figure 7:
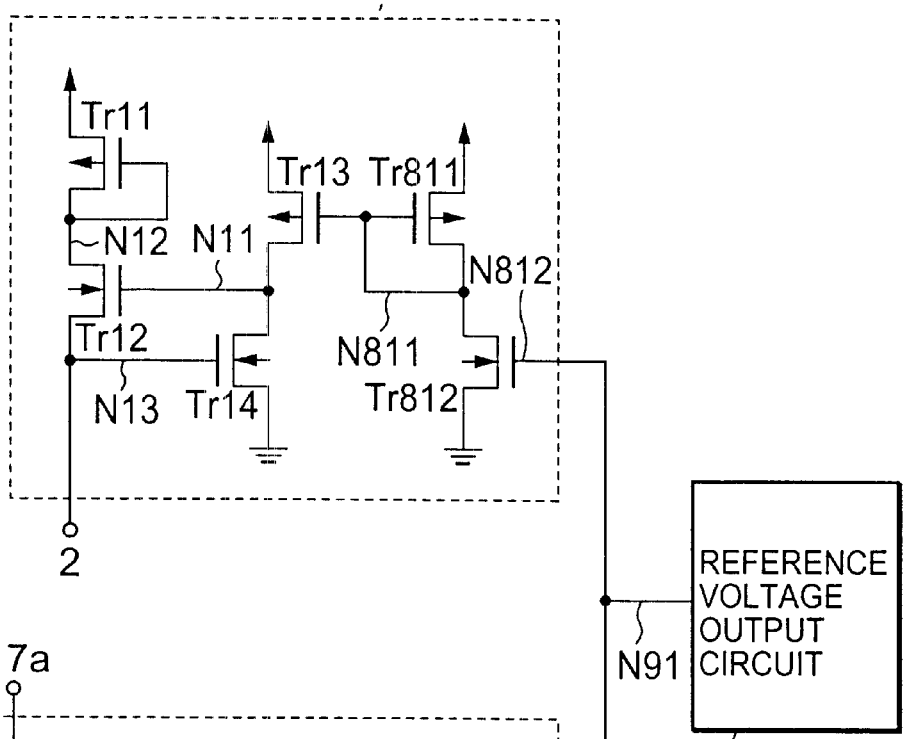
FIG. 7 is a circuit diagram showing the configurations of a cell bias circuit and a detecting circuit provided in the nonvolatile semiconductor memory according to a fourth embodiment of the present invention.
Figure 7:
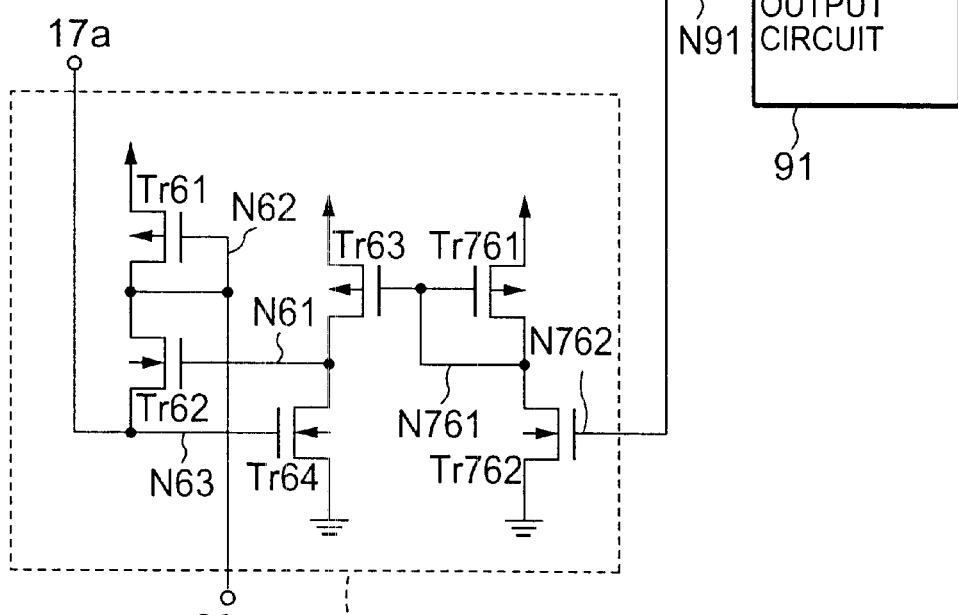

A nonvolatile semiconductor memory according to a fourth embodiment is different from the nonvolatile semiconductor memory according to the third embodiment in that the cell bias circuit 1 has been replaced by a cell bias circuit 81, and a reference voltage output circuit 91 has been added. The cell bias circuit 81 and the reference voltage output circuit 91 are shown in FIG. 7, together with a first detecting section 76a.

The cell bias circuit 81 is constructed by p-channel transistors Tr11, Tr13, and Tr811, and n-channel transistors Tr12, Tr14, and Tr812.

The source of the transistor Tr11 is connected to a power line, and the drain and the gate thereof are connected to a node N12. The drain of the transistor Tr12 is connected to the node N12, the gate thereof is connected to a node N11, and the source thereof is connected to a node N13.

The source of the transistor Tr13 is connected to a power line, the gate thereof is connected to a node N811, and the drain thereof is connected to the node N11. The drain of the transistor Tr14 is connected to the node N11, the gate thereof is connected to the node N13, and the source thereof is connected to a ground line.

The source of the transistor Tr811 is connected to a power line, and the drain and the gate thereof are connected to the node N811. The drain of the transistor Tr812 is connected to the node N811, the gate thereof is connected to a node N812, and the source thereof is connected to a ground line.

The node N13 is connected to a bias voltage supply line 2, and the node N812 is connected to an output node N91 of the reference voltage output circuit 91.

The first detecting section 76a is constructed by p-channel transistors Tr61, Tr63, and Tr761, and n-channel transistors Tr62, Tr64, and Tr762.

The source of the transistor Tr61 is connected to a power line, and the drain and the gate thereof are connected to a node N62. The drain of the transistor Tr62 is connected to the node N62, the gate thereof is connected to a node N61, and the source thereof is connected to a node N63.

The source of the transistor Tr63 is connected to a power line, the gate thereof is connected to a node N761, and the drain thereof is connected to the node N61. The drain of the transistor Tr64 is connected to the node N61, the gate thereof is connected to the node N63, and the source thereof is connected to a ground line.

The source of the transistor Tr761 is connected to a power line, and the drain and the gate thereof are connected to a node N761. The drain of the transistor Tr762 is connected to the node N761, the gate thereof is connected to a node N762, and the source thereof is connected to a ground line.

The node N63 is connected to a node 17a, and the node N62 is connected to an output node 20a of the first detecting section 6a. The node N762 is connected to the output node N91 of the reference voltage output circuit 91.

The operation of the nonvolatile semiconductor memory according to the fourth embodiment configured as set forth above will be described, mainly focusing on the operations of a detecting circuit, namely, the first detecting section 76a, and the cell bias circuit 81.

The cell bias circuit 81 is provided with a current mirror circuit constructed by the transistors Tr13, Tr14, Tr811, and Tr812. The reference voltage output from the reference voltage output circuit 91 to the output node N91 provides the reference voltage of the current mirror circuit.

The reference voltage output from the reference voltage output circuit 91 is adjusted to approximately 1 V, so that the transistors Tr13, Tr14, Tr811, and Tr812 making up the current mirror circuit are in a saturated state, and the current mirror circuit has a large voltage amplification factor.

For example, if the voltage of a bias voltage supply line 2 connected to the node N13 drops below the reference voltage of the current mirror circuit, then the conductance of the transistor Tr14 reduces accordingly. On the other hand, the transistor Tr13 provides a constant current based on the reference voltage, so that the potential at the node N11 rapidly rises. The transistor Tr12 rapidly increases the conductance in response to the rise in the potential at the node N11. Charges are supplied to the node N13 via the transistors Tr11 and Tr12. This causes the potential of the bias voltage supply line 2 connected to the node N13 to be set back to the level equal to the level of the reference voltage.

Conversely, if the voltage of the bias voltage supply line 2 connected to the node N13 rises above the reference voltage of the current mirror circuit provided in the cell bias circuit 81, then a rise in the voltage of the bias voltage supply line 2 will be controlled to a minimum.

Thus, the cell bias circuit 81 operates to maintain the bias voltage supply line 2 at the voltage level equal to the level of the reference voltage output from the reference voltage output circuit 91.

The first detecting section 76a and a second detecting section 76b are provided with current mirror circuits, each of which is constructed by transistors Tr63, Tr64, Tr761, and Tr762. The reference voltage output from the reference voltage output circuit 91 to the output node N91 provides the reference voltage of the current mirror circuits.

The reference voltage output from the reference voltage output circuit 91 is adjusted to approximately 1 V, so that the transistors Tr63, Tr64, Tr761, and Tr762 making up the current mirror circuit are in a saturated state, and the current mirror circuit has a large voltage amplification factor.

For example, if the voltage at the node 17a drops below the reference voltage of the current mirror circuit, then the conductance of the transistor Tr64 reduces accordingly. On the other hand, the transistor Tr63 provides a constant current based on the reference voltage, so that the potential at the node N61 rapidly rises. The transistor Tr62 rapidly increases the conductance in response to the rise in the potential at the node N61. Charges are supplied to the node 17a via the transistors Tr61 and Tr62. This causes the potential at the node 17a to be set back to the level equal to the level of the reference voltage.

Conversely, if the voltage at the node 17a rises above the reference voltage of the current mirror circuit provided in the first detecting section 76a, then a rise in the voltage at the node 17a will be controlled to a minimum.

Thus, the first detecting section 76a operates to maintain the node 17a at the voltage level equal to the level of the reference voltage output from the reference voltage output circuit 91.

The operations of the cell bias circuit 81 and the first detecting section 76a make the potentials of both the bias voltage supply line 2 and the node 17a coincide with the reference voltage.

As set forth above, the nonvolatile semiconductor memory according to the fourth embodiment is equipped with the independent reference voltage output circuit 91. Based on the reference voltage output from the reference voltage output circuit 91, the cell bias circuit 81 generates the bias voltage (equalizing voltage), and the detecting circuit (the first detecting section 76a and the second detecting section 76b) generates the sense voltage. Thus, even if, for example, the bias voltage fluctuates while a non-selected source line is being charged, the detecting circuit will be able to perform stable and fast detection. Furthermore, the margin for the finish variations of transistors, which present a serious problem as the;circuits become finer, will be secured.

Fifth Embodiment

Figure 8:
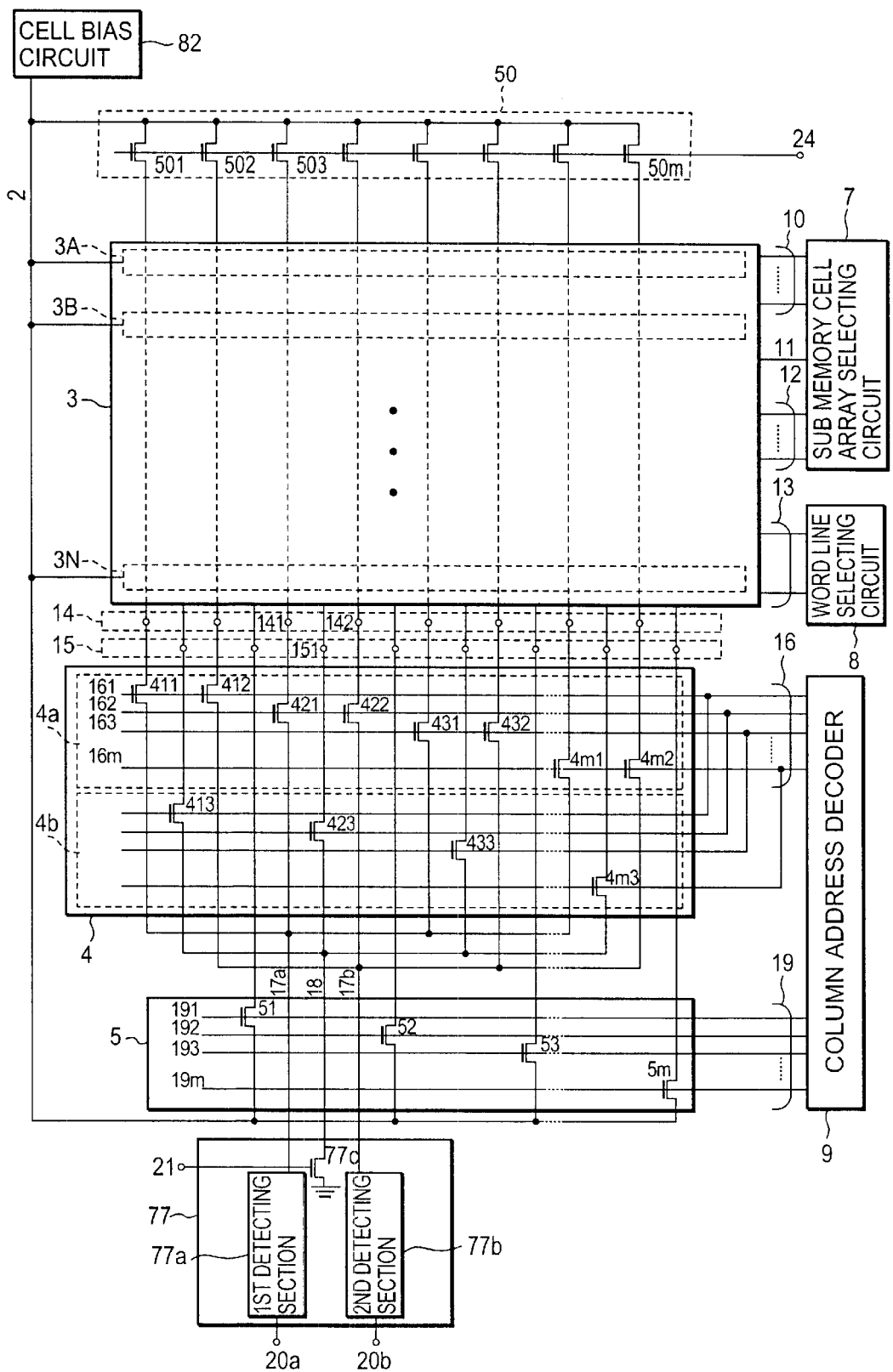
FIG. 8 is a circuit diagram showing the configuration of a nonvolatile semiconductor memory according to a fifth embodiment of the present invention.

The configuration of a nonvolatile semiconductor memory according to a fifth embodiment of the present invention is shown in FIG. 8.

A nonvolatile semiconductor memory according to the fifth embodiment is different from the nonvolatile semiconductor memory according to the first embodiment in that the cell bias circuit 1 and the detecting circuit 6 have been replaced by a cell bias circuit 82 and a detecting circuit 77, and a bit line equalizing transistor group 50 has been added.

The bit line equalizing transistor group 50 is constituted by n-channel transistors 501, 502, . . . , 50m. The drains of the transistors 501, 502, . . . , 50m are commonly connected to a bias voltage supply line 2, the gates thereof are commonly connected to a control node 24, and the sources thereof are respectively connected to bit lines . . . , 141, 142, and so on.

The detecting circuit 77 is provided with a first detecting section 77a and a second detecting section 77b that share the same circuit, and an n-channel transistor 77c.

In the nonvolatile semiconductor memory according to the first embodiment, the node 18 is directly connected to the ground line, whereas in this embodiment, the node 18 is connected to the ground line via the transistor 77c. The gate of the transistor 77c is connected to a control node 22. When the control node 22 is at the H level, the node 18 is set at a ground level.

The circuit configurations of the cell bias circuit 82 and the first detecting section 77a (the second detecting section 77b) will be described with reference to FIG. 9.

The cell bias circuit 82 is constructed by an operation-mode cell bias voltage retaining circuit 83 (a first constant voltage generating section) and a standby-mode cell bias voltage retaining circuit 84 (a second constant voltage generating section).

In a system in which the nonvolatile semiconductor memory according to the fifth embodiment is built, when the nonvolatile semiconductor memory is writing/reading data (including a case where the nonvolatile semiconductor memory is ready for writing/reading data), it will be described that the nonvolatile semiconductor memory is in an operation mode. Conversely, in the system, when a minimum of electric power is being supplied (or no electric power is being supplied) to the nonvolatile semiconductor memory for the purpose of reducing power consumption or the like, it will be described that the nonvolatile semiconductor memory is in a standby mode.

The operation-mode cell bias voltage retaining circuit 83 is constructed by p-channel transistors Tr11 and Tr13, and n-channel transistors Tr12, Tr14, and Tr831.

The source of the transistor Tr11 is connected to a power line, and the drain and the gate thereof are connected to a node N12. The drain of the transistor Tr12 is connected to the node N12, the gate thereof is connected to a node N11, and the source thereof is connected to a node N13.

The source of the transistor Tr13 is connected to a power line, the gate thereof is connected to a node N831, and the drain thereof is connected to the node N11. The drain of the transistor Tr14 is connected to the node N11, the gate thereof is connected to the node N13, and the source thereof is connected to a ground line.

The drain of the transistor Tr831 is connected to the node N11, the gate thereof is connected to the node N831, and the source thereof is connected to a ground line.

The node N13 is connected to a bias voltage supply line 2, and the node N831 is connected to the control node 22.

The standby-mode cell bias voltage retaining circuit 84 is constructed by p-channel transistors Tr841 and Tr843, and n-channel transistors Tr842, Tr844, and Tr845.

The source of the transistor Tr841 is connected to a power line, and the drain and the gate thereof are connected to a node N842. The drain of the transistor Tr842 is connected to the node N842, the gate thereof is connected to a node N841, and the source thereof is connected to a node N843.

The source of the transistor Tr843 is connected to a power line, the gate thereof is connected to a ground line, and the drain thereof is connected to the node N841. The drain of the transistor Tr844 is connected to the node N841, the gate thereof is connected to the node N843, and the source thereof is connected to a ground line.

The drain and the gate of the transistor Tr845 are connected to the node N843, and the source thereof is connected to a ground line.

The node N843 is connected to the bias voltage supply line 2.

The first detecting section 77a is constructed by p-channel transistors Tr61 and Tr63, and n-channel transistors Tr62, Tr64, and Tr771.

The source of the transistor Tr61 is connected to a power line, and the drain and the gate thereof are connected to a node N62. The drain of the transistor Tr62 is connected to the node N62, the gate thereof is connected to a node N61, and the source thereof is connected to a node N63.

The source of the transistor Tr63 is connected to a power line, the gate thereof is connected to a node N771, and the drain thereof is connected to the node N61. The drain of the transistor Tr64 is connected to the node N61, the gate thereof is connected to the node N63, and the source thereof is connected to a ground line.

The drain of the transistor Tr771 is connected to the node N61, the gate thereof is connected to the node N771, and the source thereof is connected to a ground line.

The node N63 is connected to a node 17a, and the node N62 is connected to an output node 20a of the first detecting section 6a. The node N771 is connected to the control node 22.

The operation of the nonvolatile semiconductor memory according to the fifth embodiment constructed as set forth above will now be described.

When the nonvolatile semiconductor memory according to the fifth embodiment is in the standby mode, a sub memory cell array selecting circuit 7 equalizes the source lines and the drain lines of all sub memory cell arrays 3A through 3N. Hence, all source equalizing selection lines making up a source equalizing selection line group 10 and all drain equalizing selection lines making up a drain equalizing selection line group 11 are set at the H level.

At this time, the sub memory cell array selection lines making up a sub memory cell array selection line 12, the word lines making up a word line group 13, the column selection lines making up a column selection line group 16, and non-selected column selection lines making up a non-selected column selection line group 19 may take arbitrary logic levels.

When the nonvolatile semiconductor memory according to the fifth embodiment is in the standby mode, the control node 21 is set at the L level. This causes the transistor 77c to be set to the OFF state or the non-conducting state, thus preventing short-circuiting between the bias voltage supply line 2 and the ground line. When the nonvolatile semiconductor memory according to the fifth embodiment is in the operation mode, the control node 21 is set at the H level, and the transistor 77c is set to the ON state or the conducting state.

When the nonvolatile semiconductor memory according to the fifth embodiment is in the standby mode, the control node 24 is set at the L level. Thus, in the standby mode, a terminal 24 is set at the H level, all transistors 501, 502, ..., and 50m making up the bit line equalizing transistor group 50 are set to the ON state or the conducting state, and the bias voltage output from the cell bias circuit 82 is applied to all the bit lines. When the nonvolatile semiconductor memory according to the fifth embodiment is in the operation mode, the control node 24 is set to the L level, and all the transistors 501, 502, ..., and 50m making up a bit line equalizing transistor group 50 are set to the OFF state or the non-conducting state.

Figure 9:
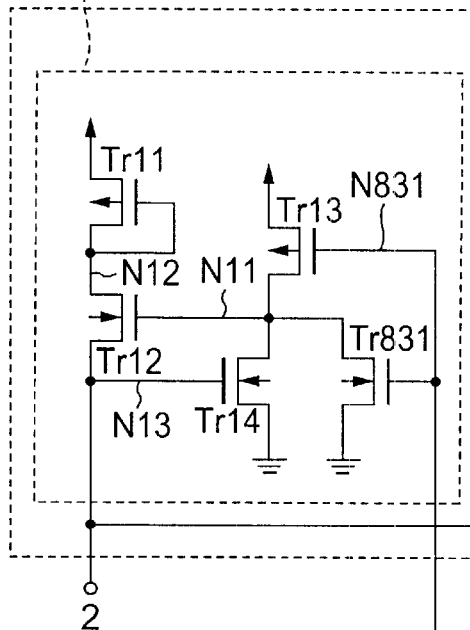
FIG. 9 is a circuit diagram showing the configuration of a cell bias circuit and a detecting circuit provided in the nonvolatile semiconductor memory shown in FIG. 8.
Figure 9:
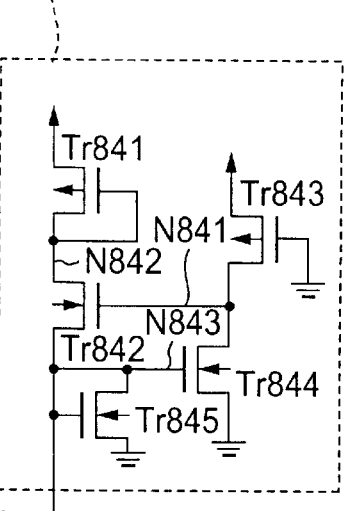
Figure 9:
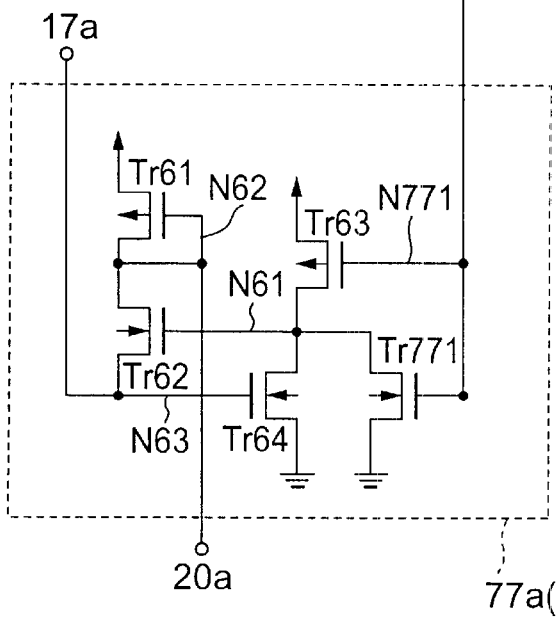

Referring now to FIG. 9, the operations of the cell bias circuit 82 and the first detecting section 77a will be described.

When the nonvolatile semiconductor memory according to the fifth embodiment is in the standby mode, an H-level mode signal is applied to the control node 22. This causes the transistor Tr13 belonging to the operation-mode cell bias voltage retaining circuit 83 to be turned OFF, the transistor Tr831 to be turned ON, and the node N11 to be set to the ground level. When the node N11 is set at the ground level, the transistor Tr12 is turned OFF.

Similarly, if the control node 22 is set at the H level, then the transistor Tr63 belonging to the first detecting section 77a is turned OFF, the transistor Tr771 is turned ON, and the node N61 is set at the ground level. When the node N61 is set at the ground level, the transistor Tr62 is turned OFF.

Thus, while the nonvolatile semiconductor memory according to the fifth embodiment is in the standby mode, the operation-mode cell bias voltage retaining circuit 83 and the first detecting section 77a do not consume electric power. Hence, the operation-mode cell bias voltage retaining circuit 83 and the first detecting section 77a do not output voltage to the memory cell arrays.

When the nonvolatile semiconductor memory according to the fifth embodiment is in the standby mode, the standby-mode cell bias voltage retaining circuit 84 functions as a constant-voltage source. The output voltage characteristic thereof is substantially the same as those of the operation-mode cell bias voltage retaining circuit 83 and the first detecting section 77a.

In the standby mode, the bit lines, the main source lines, the drain lines, and the source lines in the memory cell arrays are equalized by the standby-mode cell bias voltage retaining circuit 84.

If the voltage of the bias voltage supply line 2 drops below an equalizing voltage, then the conductance of the transistor Tr844 belonging to the standby-mode cell bias voltage retaining circuit 84 reduces, while the potential at the node N841 increases. This causes the conductance of the transistor Tr842 to increase, and the potential at the node N843 to increase. Thus, the potential of the bias voltage supply line 2 connected to the node N843 is adjusted back to the level of the equalizing voltage.

Conversely, if the voltage of the bias voltage supply line 2 exceeds the equalizing voltage, then the conductance of the transistor Tr844 increases, while the potential at the node N841 drops. This causes the conductance of the transistor Tr842 to decrease, and the potential at the node N843 to decrease. Thus, the potential of the bias voltage supply line 2 connected to the node N843 is adjusted back to the level of the equalizing voltage.

As described above, while the nonvolatile semiconductor memory according to the fifth embodiment is in the standby mode, the potential of the bias voltage supply line 2 is maintained at a constant level by the standby-mode cell bias voltage retaining circuit 84. In order to minimize the power consumption by the cell bias circuit 82 in the standby mode, the conductances of the transistor Tr841 and the transistor Tr843 belonging to the standby-mode cell bias voltage retaining circuit 84 are set to sufficiently small values. The conductances of the transistors Tr842, Tr844, and Tr845 are set on the basis of the conductances of the transistors Tr841 and Tr843 in order to output a bias voltage (equalizing voltage) equal to that of the operation-mode cell bias voltage retaining circuit 83 to the bias voltage supply line 2.

Thus, according to the nonvolatile semiconductor memory in accordance with the fifth embodiment, in the standby mode, the operation-mode cell bias voltage retaining circuit 83 and the detecting circuit 77 can be set to a disable mode so as to reduce power consumption. Moreover, since the cell bias voltage in the standby mode is maintained at a constant level by the standby-mode cell bias voltage retaining circuit 84 consuming a small amount of power, it is possible to start data writing or reading immediately after a shift to the operation mode.

Sixth Embodiment

Figure 10:
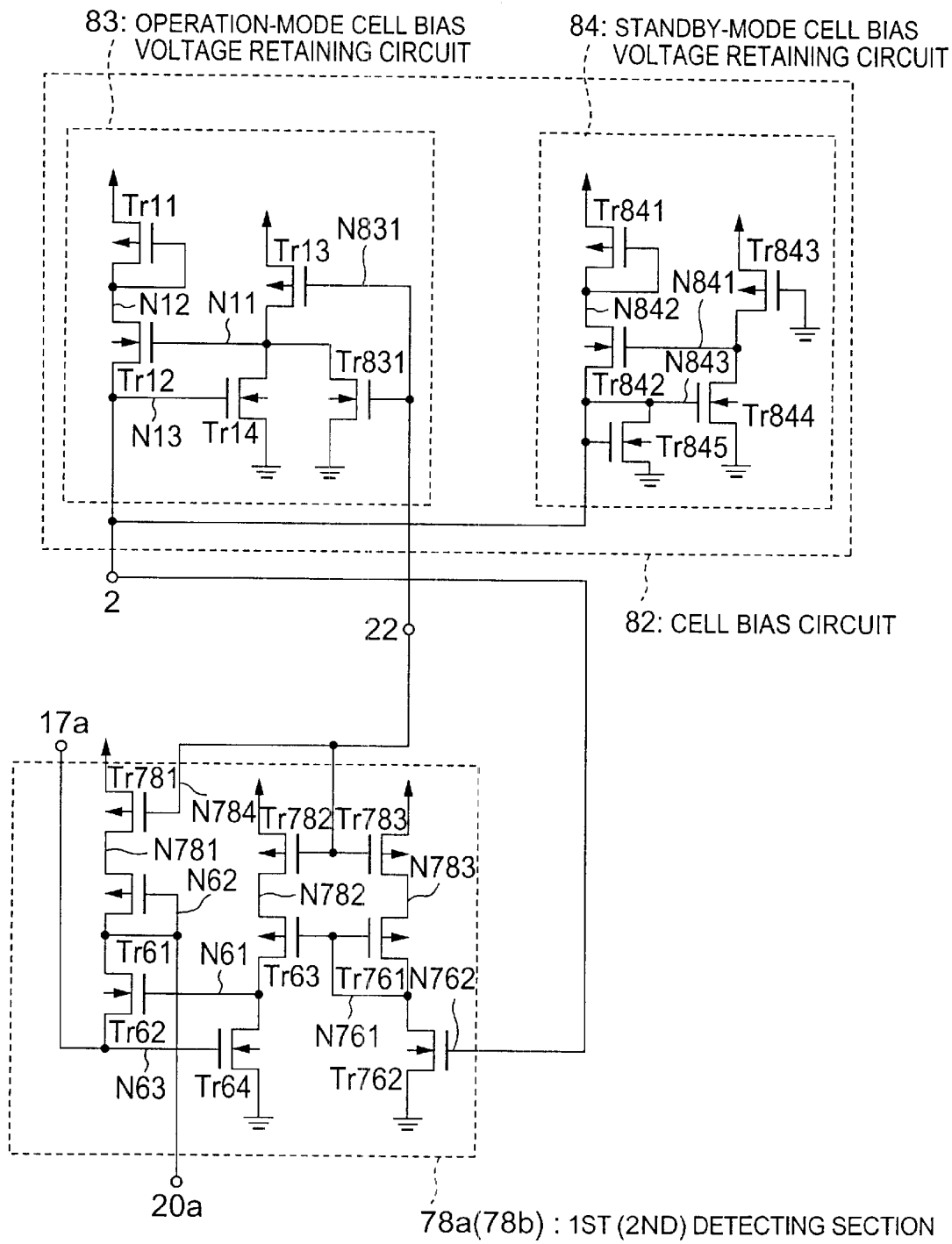
FIG. 10 is a circuit diagram showing the configurations of a-cell bias circuit and a detecting circuit provided in the nonvolatile semiconductor memory according to a sixth embodiment of the present invention.

A nonvolatile semiconductor memory according to a sixth embodiment is different from the nonvolatile semiconductor memory according to the fifth embodiment in that the detecting circuit 77 has been replaced by a detecting circuit composed of a first detecting section 78a, a second detecting section 78b, and a transistor 77c. The first detecting section 78a and the second detecting section 78b share the same circuit configuration. The first detecting section 78a is shown in FIG. 10, together with a cell bias circuit 82.

The first detecting section 78a is constituted by p-channel transistors Tr61, Tr63, Tr761, Tr781, Tr782, and Tr783, and n-channel transistors Tr62, Tr64, and Tr762. In other words, the first detecting section 78a is different from the first detecting section 76a shown in FIG. 6 in that the p-channel transistors Tr781, Tr782, and Tr783 have been added.

The source of the transistor Tr61 is connected to a node N781, and the drain and the gate thereof are connected to a node N62. The drain of the transistor Tr62 is connected to the node N62, the gate thereof is connected to a node N61, and the source thereof is connected to a node N63.

The source of the transistor Tr63 is connected to a node N782, the gate thereof is connected to a node N761, and the drain thereof is connected to the node N61. The drain of the transistor Tr64 is connected to the node N61, the gate thereof is connected to the node N63, and the source thereof is connected to a ground line.

The source of the transistor Tr761 is connected to a node N783, and the drain and the gate thereof are connected to the node N761. The drain of the transistor Tr762 is connected to the node N761, the gate thereof is connected to a node N762, and the source thereof is connected to a ground line.

The source of the transistor Tr781 is connected to a power line, the gate thereof is connected to a node N784, and the drain thereof is connected to the node N781. The source of the transistor Tr782 is connected to the power line, the gate thereof is connected to a node N784, and the drain thereof is connected to a node N782. The source of the transistor Tr783 is connected to the power line, the gate thereof is connected to the node N784, and the drain thereof is connected to a node N783.

The node N63 is connected to a node 17a, the node N62 is connected to an output node 20a of the first detecting section 78a. The node N762 is connected to the bias voltage supply line 2. The node N784 is connected to a control node 22.

The operation of the nonvolatile semiconductor memory according to the sixth embodiment configured as set forth above will be described, mainly focusing on the operations of a detecting circuit, namely, the first detecting section 78a, and the cell bias circuit 82.

When the nonvolatile semiconductor memory according to the sixth embodiment is in the standby mode, an H-level mode signal is applied to the control node 22. This causes the transistor Tr13 belonging to an operation-mode cell bias voltage retaining circuit 83 to be turned OFF, the transistor Tr831 to be turned ON, and the node N11 to be set at the ground level. When the node N11 is set at the ground level, the transistor Tr12 is turned OFF.

Similarly, if the control node 22 is set at the H level, then the transistors Tr781, Tr782, and Tr783 belonging to the first detecting section 78a are turned OFF.

Thus, while the nonvolatile semiconductor memory according to the sixth embodiment is in the standby mode, the operation-mode cell bias voltage retaining circuit 83 and the first detecting section 78a do not consume electric power. Hence, the operation-mode cell bias voltage retaining circuit 83 and the first detecting section 78a do not output voltage to memory cell arrays.

When the nonvolatile semiconductor memory according to the sixth embodiment is in the standby mode, a standby-mode cell bias voltage retaining circuit 84 functions as a constant-voltage source. The output voltage characteristic thereof is substantially the same as those of the operation-mode cell bias voltage retaining circuit 83 and the first detecting section 78a.

In the standby mode, the bit lines, the main source lines, the drain lines, and the source lines in the memory cell arrays are equalized by the standby-mode cell bias voltage retaining circuit 84.

When the nonvolatile semiconductor memory according to the sixth embodiment is in the operation mode, an L-level mode signal is applied to the control node 22. This causes the standby-mode cell bias voltage retaining circuit 84 to be set to a disable state, and the operation-mode cell bias voltage retaining circuit 83 to be set to an enable state. At this time, the operations of the operation-mode cell bias voltage retaining circuit 83 and the first detecting section 78a will be substantially identical to those of the cell bias circuit 1 and the first detecting section 76a provided in the nonvolatile semiconductor memory according to the third embodiment shown in FIG. 6.

As described above, the nonvolatile semiconductor memory according to the sixth embodiment makes it possible to reduce power consumption in the standby mode. Furthermore, in the operation mode, the sense voltage output to the node 17a and the bias voltage (equalizing voltage) output to the bias voltage supply line 2 are adjusted to be the same level.

Seventh Embodiment

Figure 11:
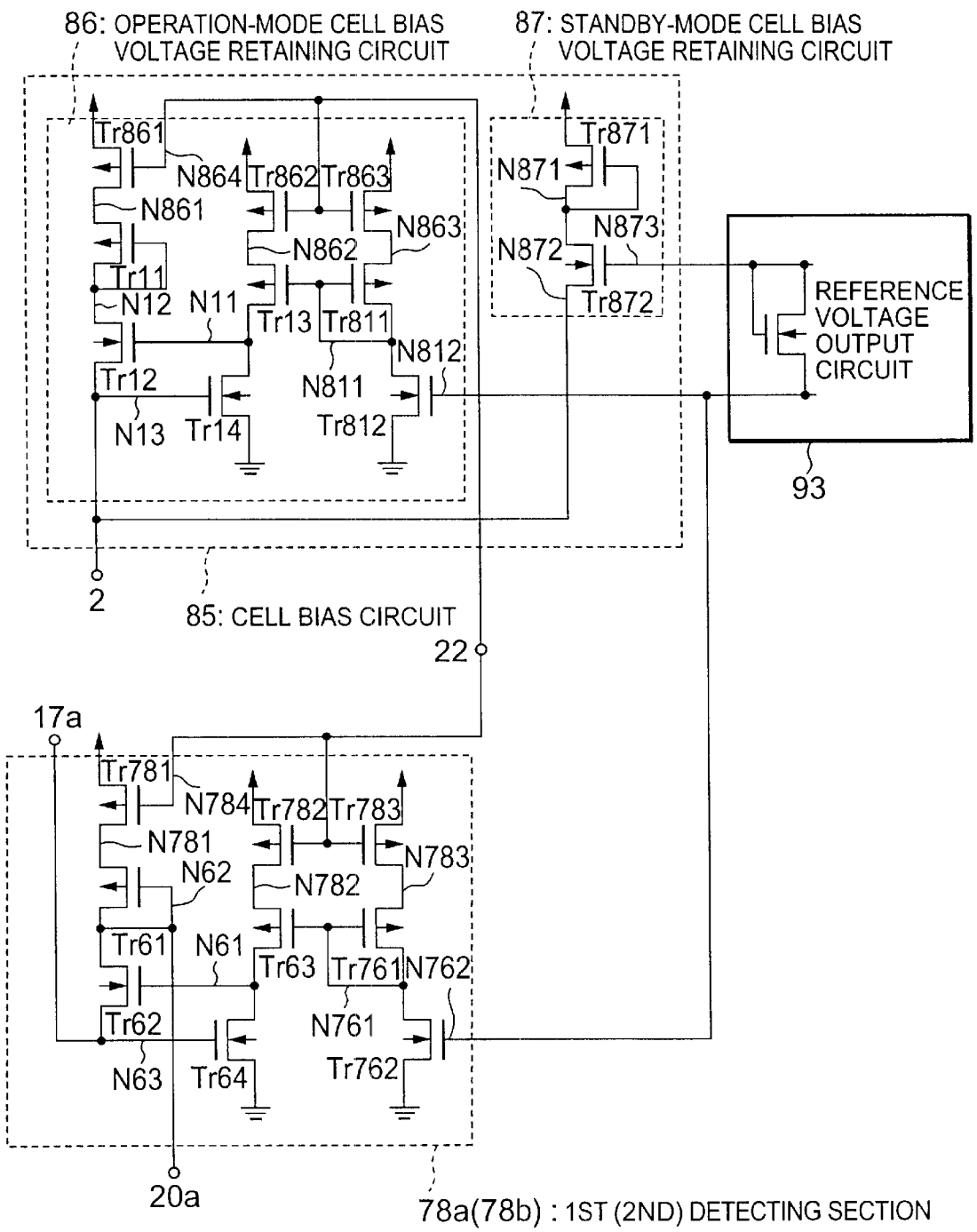
FIG. 11 is a circuit diagram showing the configurations of a cell bias circuit, a detecting circuit, and a reference voltage output circuit provided in the nonvolatile semiconductor memory according to a seventh embodiment of the present invention.

A nonvolatile semiconductor memory according to a seventh embodiment is different from the nonvolatile semiconductor memory according to the sixth embodiment in that the cell bias circuit 82 has been replaced by a cell bias circuit 85, and a reference voltage output circuit 93 has been added. The cell bias circuit 85 and the reference voltage output circuit 93 are shown in FIG. 11, together with a first detecting section 78a.

The cell bias circuit 85 is constituted by an operation-mode cell bias voltage retaining circuit 86 and a standby-mode cell bias voltage retaining circuit 87.

The operation-mode cell bias voltage retaining circuit 86 is constructed by p-channel transistors Tr11, Tr13, Tr811, Tr861, Tr862, and Tr863, and n-channel transistors Tr12, Tr14, and Tr812. In other words, the operation-mode cell bias voltage retaining circuit 86 has the p-channel transistors Tr861, Tr862, and Tr863 added to the cell bias circuit 81 shown in FIG. 7

The source of the transistor Tr11 is connected to a node N861, and the drain and the gate thereof are connected to a node N12. The drain of the transistor Tr12 is connected to the node N12, the gate thereof is connected to a node N11, and the source thereof is connected to a node N13.

The source of the transistor Tr13 is connected to a node N862, the gate thereof is connected to a node N811, and the drain thereof is connected to the node N11. The drain of the transistor Tr14 is connected to the node N11, the gate thereof is connected to the node N13, and the source thereof is connected to a ground line.

The source of the transistor Tr811 is connected to a node N863, and the drain and the gate thereof are connected to the node N811. The drain of the transistor Tr812 is connected to the node N811, the gate thereof is connected to a node N812, and the source thereof is connected to a ground line.

The source of the transistor Tr861 is connected to a power line, the gate thereof is connected to a node N864, and the drain thereof is connected to a node N861. The drain of the transistor Tr862 is connected to the power line, the gate thereof is connected to a node N864, and the drain thereof is connected to a node N862. The drain of the transistor Tr863 is connected to the power line, the gate thereof is connected to the N864, and the drain thereof is connected to the node N863.

The node N13 is connected to a bias voltage supply line 2, and the node N812 is connected to the reference voltage output circuit 93.

The standby-mode cell bias voltage retaining circuit 87 is constructed by a p-channel transistor Tr871 and an n-channel transistor Tr872.

The source of the transistor Tr871 is connected to a power line, and the drain and the gate thereof are connected to a node N871. The drain of the transistor Tr872 is connected to the node N871, the gate thereof is connected to a node N873, and the source thereof is connected to a node N872.

The node N872 is connected to a bias voltage supply line 2, and the node N873 is connected to the reference voltage output circuit 93.

In the nonvolatile semiconductor memory according to the sixth embodiment, the node N762 of the first detecting section 78*a* is connected to the bias voltage supply line 2, as shown in FIG. 10, whereas a node N762 of the first detecting section 78*a* in this embodiment is connected to the reference voltage output circuit 93.

The operation of the nonvolatile semiconductor memory according to the seventh embodiment configured as set forth above will be described, mainly focusing on the operations of a detecting circuit, namely, the first detecting section 78*a*, and the cell bias circuit 85.

When the nonvolatile semiconductor memory according to the seventh embodiment is in the standby mode, an H-level mode signal is applied to the control node 22. This causes the transistors Tr861, Tr862, and Tr863 belonging to an operation-mode cell bias voltage retaining circuit 86 to be turned OFF. Similarly, the transistors Tr781, Tr782, and Tr783 belonging to the first detecting section 78*a* are turned OFF.

Thus, while the nonvolatile semiconductor memory according to the seventh embodiment is in the standby mode, the operation-mode cell bias voltage retaining circuit 86 and the first detecting section 78*a* do not consume electric power. Hence, the operation-mode cell bias voltage retaining circuit 86 and the first detecting section 78*a* do not output voltage to memory cell arrays.

When the nonvolatile semiconductor memory according to the seventh embodiment is in the standby mode, the standby-mode cell bias voltage retaining circuit 87 functions as a constant-voltage source. The output voltage characteristic thereof is substantially the same as those of the operation-mode cell bias voltage retaining circuit 86 and the first detecting section 78*a*.

In the standby mode, the bit lines, the main source lines, the drain lines, and the source lines in the memory cell arrays are equalized by the standby-mode cell bias voltage retaining circuit 87.

As described above, the nonvolatile semiconductor memory according to the seventh embodiment makes it possible to reduce power consumption in the standby mode. Furthermore, in the operation mode, the sense voltage output to the node 17*a* and the bias voltage (equalizing voltage) output to the bias voltage supply line 2 are adjusted to be the same level.

Eighth Embodiment

Figure 12:
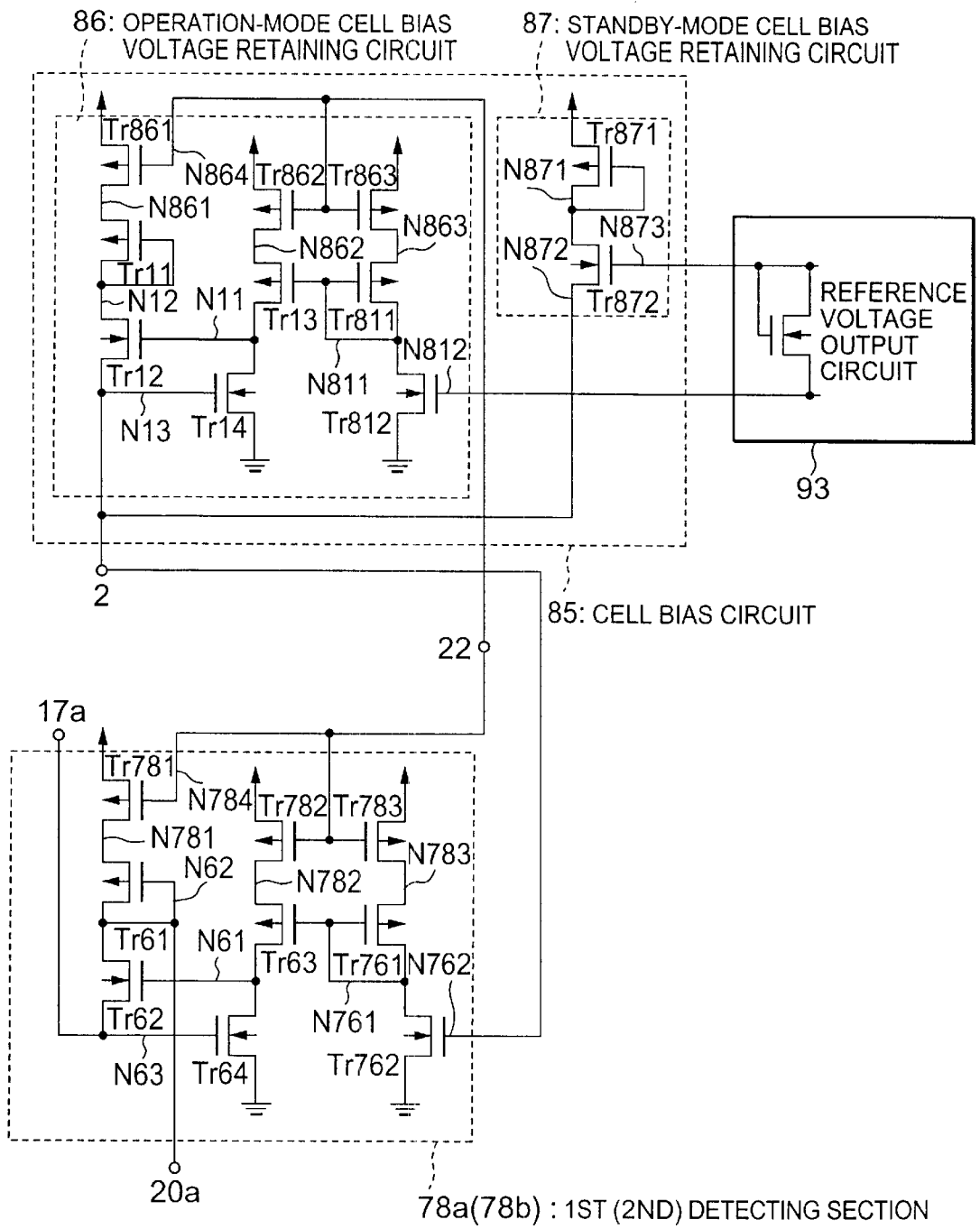
FIG. 12 is a circuit diagram showing the configurations of a cell bias circuit, a detecting circuit, and a reference voltage output circuit provided in the nonvolatile semiconductor memory according to an eighth embodiment of the present invention.

As shown in FIG. 12, a nonvolatile semiconductor memory according to an eighth embodiment is different from the nonvolatile semiconductor memory according to the seventh embodiment only in that the node N762 of the first detecting section 78*a* is connected to the bias voltage supply line 2 rather than the reference voltage output circuit 93.

When the nonvolatile semiconductor memory according to the eighth embodiment is in the standby mode, only a standby-mode cell bias voltage retaining circuit 87 provided in a cell bias circuit 85 is energized. The nonvolatile semiconductor memory according to the eighth embodiment performs substantially the same operation as that of the nonvolatile semiconductor memory according to the seventh embodiment.

When the nonvolatile semiconductor memory according to the eighth embodiment is in the operation mode, an operation-mode cell bias voltage retaining circuit 86 provided in the cell bias circuit 85 is energized. There is a parasitic capacitor in the bias voltage supply line 2 and the circuits connected thereto. The parasitic capacitor is charged by the standby-mode cell bias voltage retaining circuit 87 in the standby mode. Hence, the mode is switched to the operation mode, the cell bias voltage (equalizing voltage) output by the operation-mode cell bias voltage retaining circuit 86 is instantaneously stabilized to a steady state. Moreover, the first detecting section 78*a* and a second detecting section 78*b* quickly shift to a current detection mode on the basis of the cell bias-voltage output from the cell bias circuit 85.

As set forth above, the nonvolatile semiconductor memory according to the eighth embodiment provides the same advantages as those of the nonvolatile semiconductor memory according to the seventh embodiment. Furthermore, according to the nonvolatile semiconductor memory according to the eighth embodiment, the output of the reference voltage output circuit 93 is not connected to the first detecting section 78*a* and the second detecting section 78*b*, thus preventing fluctuations in the reference voltage output from the reference voltage output circuit 93 caused by transistor capacitance coupling during a mode shift, especially from the standby mode to the operation mode, of the first detecting section 78a and the second detecting section 78b.

A current mirror circuit provided in the first. detecting section 78a and the second detecting section 78b is configured so as to directly obtain a reference voltage from the bias voltage supply line 2. With this arrangement, if a potential fluctuation takes place in the bias voltage supply line 2, then the first detecting section 78a and the second detecting section 78b will be able to output a sense voltage precisely based on the potential fluctuation to nodes 17a and 17b without a delay.

The circuit configurations of the nonvolatile semiconductor memories according to the first through eighth embodiments described so far have been design for data read only. The present invention, however, can be also applied to nonvolatile semiconductor memories also provided with circuits for writing data. The following will describe nonvolatile semiconductor memories capable of writing and reading data, as additional embodiments in accordance with the present invention.

Ninth Embodiment

Figure 13:
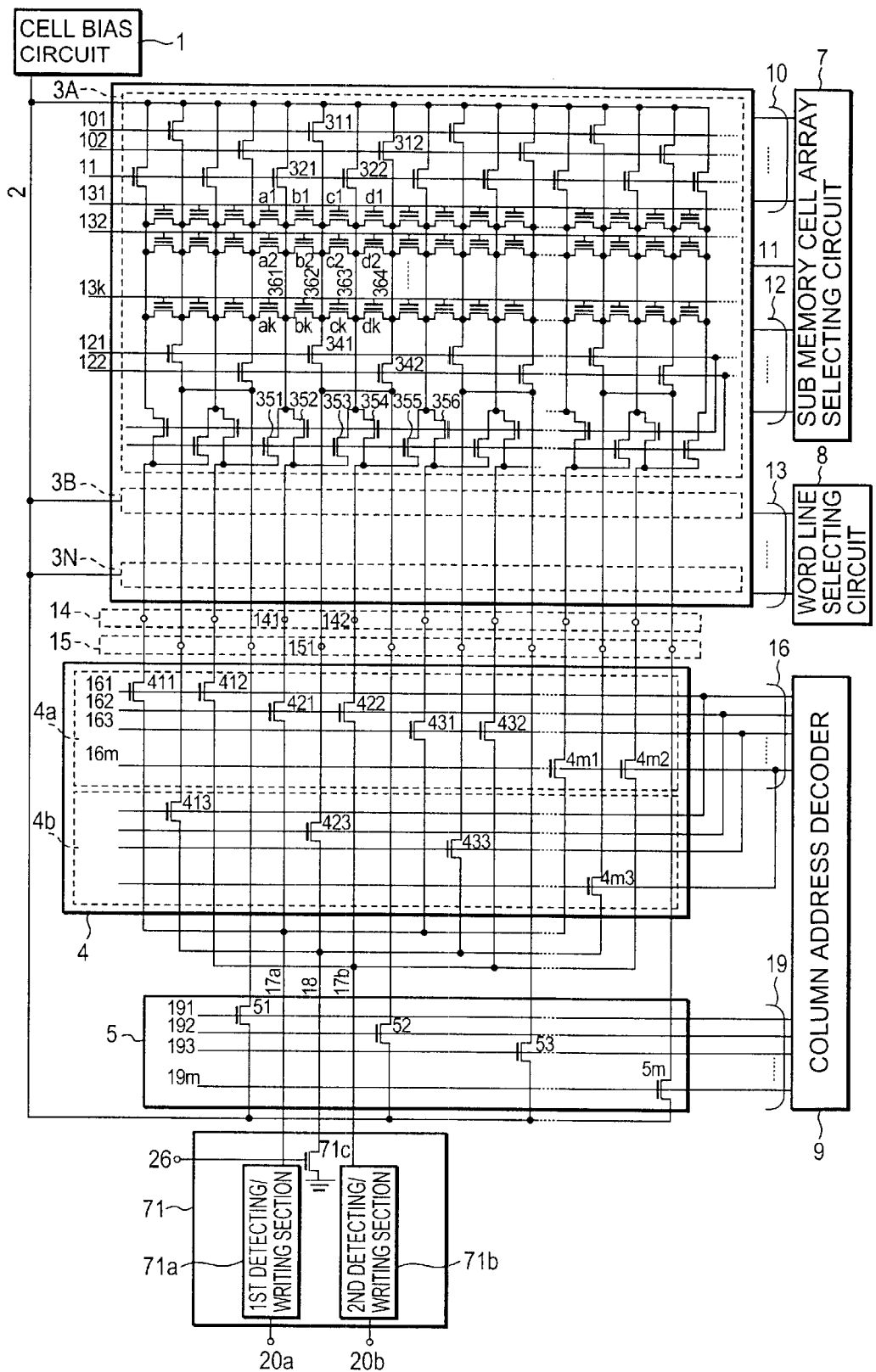
FIG. 13 is a circuit diagram showing the configuration of a nonvolatile semiconductor memory according to a ninth embodiment of the present invention.

As shown in FIG. 13, the nonvolatile semiconductor memory according to a ninth embodiment is different from the nonvolatile semiconductor memory according to the first embodiment in that the detecting circuit 6 has been replaced by a detecting/writing circuit 71, and an electrical data writing function has been added.

In the detecting/writing circuit 71, the first detecting section 6a and the second detecting section 6b in the detecting circuit 6 have been replaced by a first detecting/writing section 71a and a second detecting/writing section 71b, respectively, and an n-channel transistor 71c has been added.

In the nonvolatile semiconductor memory according to the first embodiment, a node 18 is directly connected to the ground line, whereas the node 18 in this embodiment is connected to a ground line via the transistor 71c. The gate of the transistor 71c is connected to a control node 26. When the control node 26 is set at the H-level, the node 18 is set at the ground level.

To read data, the control node 26 is set at the H-level, and the transistor 71c is turned ON. The nonvolatile semiconductor memory according to the ninth embodiment performs substantially the same data reading operation as that of the nonvolatile semiconductor memory according to the first embodiment.

The data writing operation of the nonvolatile semiconductor memory according to the ninth embodiment will be described. In the data writing operation, the relationship in terms of potential between the source and the drain in each memory cell is reversed from that in a data reading operation. In the following description, however, the designations of the circuit elements used so far will be used as they are.

In the data writing operation, a cell bias circuit 1 outputs a write voltage Vwsd to be applied to the drain of each memory cell to a bias voltage supply line 2. The first detecting/writing section 71a and the second detecting/writing section 71b that belong to the detecting/writing circuit 71 output a write voltage Vw and a non-write voltage Vn to the nodes 17a and 17b, respectively, according to the data to be written to a selected memory cell.

If a sub memory cell array 3A is not selected, then a sub memory cell array selecting circuit 7 outputs an L-level voltage V1 to source equalizing selection lines 101 and 102 connected to the sub memory cell array 3A in a source equalizing selection line group 10, and also outputs the voltage V1 to a drain equalizing selection line 11 so as to prevent any of source lines 362, 364, and so on and drain lines 361, 363, and so on that belong to the sub memory cell array 3A from being connected to the bias voltage supply line 2. Thus, all source line equalizing transistors 311, 312 and so on, and all drain line equalizing transistors 321, 322, 323 and so on, which belong to the sub memory cell array 3A are set to the OFF state or the non-conducting state.

Furthermore, the sub memory cell array selecting circuit 7 outputs the voltage V1 to sub memory cell array selection lines 121 and 122 connected to the sub memory cell array 3A in a sub memory cell array selection line group 12 so as to set all source selecting transistors 341, 342 and so on and all drain selecting transistors 351, 352 and so on that belong to the sub memory cell array 3A to the OFF state or the non-conducting state in order to disconnect the drain lines 361, 363 and so on of the sub memory cell array 3A from a bit line group 14, and to disconnect the source lines 362, 364 and so on from a main source line group 15.

Similarly, the sub memory cell array selecting,circuit 7 outputs the voltage V1 to the source equalizing selection lines, the drain equalizing selection lines, and the sub memory cell array selection lines connected to the non-selected sub memory cell arrays other than the sub memory cell array 3A.

The descriptions will be given of the operation performed by the nonvolatile semiconductor memory according to the ninth embodiment to write data to memory cells b2 and c2 belonging to the sub memory cell array 3A.

A word line selecting circuit 8 outputs a write gate voltage Vwg to a word line 132 connected to the gates. of the memory cells b2 and c2, and also outputs the voltage V1 to word lines 131, 133, . . . , and 13k other than the word line 132.

At the same time, the sub memory cell array selecting circuit 7 outputs an H-level voltage Vh to the sub memory cell array selection line 121 to set the drain selecting transistors 352 and 354 and a source selecting transistor 341 to the ON state or the conducting state. This causes the drain lines 361 and 363 connected to the drains of the memory cells b2 and c2 to be connected to bit lines 141 and 142, and a source line 362 commonly connected to the sources of the memory cells b2 and c2 to be connected to the main source line 151.

Furthermore, the sub memory cell array selecting circuit 7 outputs the gate voltage Vwg to the source equalizing selection line 101 to set the source line equalizing transistor 311 to the ON state or the conducting state to apply the write voltage Vwsd to the source line 362. The sub memory cell array selecting circuit 7 outputs the voltage V1 to a source equalizing selection line 102 so as to prevent the write voltage Vwsd from being applied to the source line to which non-selected memory cells other than the memory cells b2 and c2 are connected, and also outputs the voltage V1 to the drain equalizing selection line 11 so as to prevent the write voltage Vwsd from being applied to the drain line to which non-selected memory cells are connected.

A column address decoder 9 outputs a voltage Vh to a column selection line 162 to set a transistor 421 belonging to a bit line column switch group 4a and a transistor 423 belonging to a source line column switch group 4b to the ON state. This causes the bit line 141 and the node 17a to be connected, the bit line 142 and the node 17b to be connected, and the main source line 151 and the node 18 to be connected.

At the same time, a column address decoder 9 outputs the voltage V1 to column selection lines 161, 163, ..., and 16*m* other than the column selection line 162 in order to turn OFF the transistors other than the transistor 421 that belong to the bit line column switch group 4*a* and the transistors other than the transistor 423 that belong to the source line column switch group 4*b*. This causes the non-selected bit lines other than the selected bit lines 141 and 142 and the non-selected main source lines other than the selected main source line 151 to be isolated from the detecting/writing circuit 71.

Furthermore, the column address decoder 9 outputs the voltage V1 to non-selected column selection lines 191, ... and 19*m* to set transistors 51, ..., 5*m* constituting a non-selected source line equalizing transistor group 5 to the OFF state or the non-conducting state. This prevents the write voltage Vwsd from being applied to the source lines from the non-selected source line equalizing transistor group 5.

During the writing operation, the voltage V1 is applied to a control node 26 to set the transistor 71*c* to the OFF state or the non-conducting state in order to prevent a short circuit between the bias voltage supply line 2 and the ground line through the source line equalizing transistor 311.

As is obvious from the above description, the present invention can be applied also the a nonvolatile semiconductor memory having a data writing function. Furthermore, the nonvolatile semiconductor memory according to the ninth embodiment is able to provide the same advantages as those of the nonvolatile semiconductor memory according to the first embodiment.

Tenth Embodiment

Figure 14:
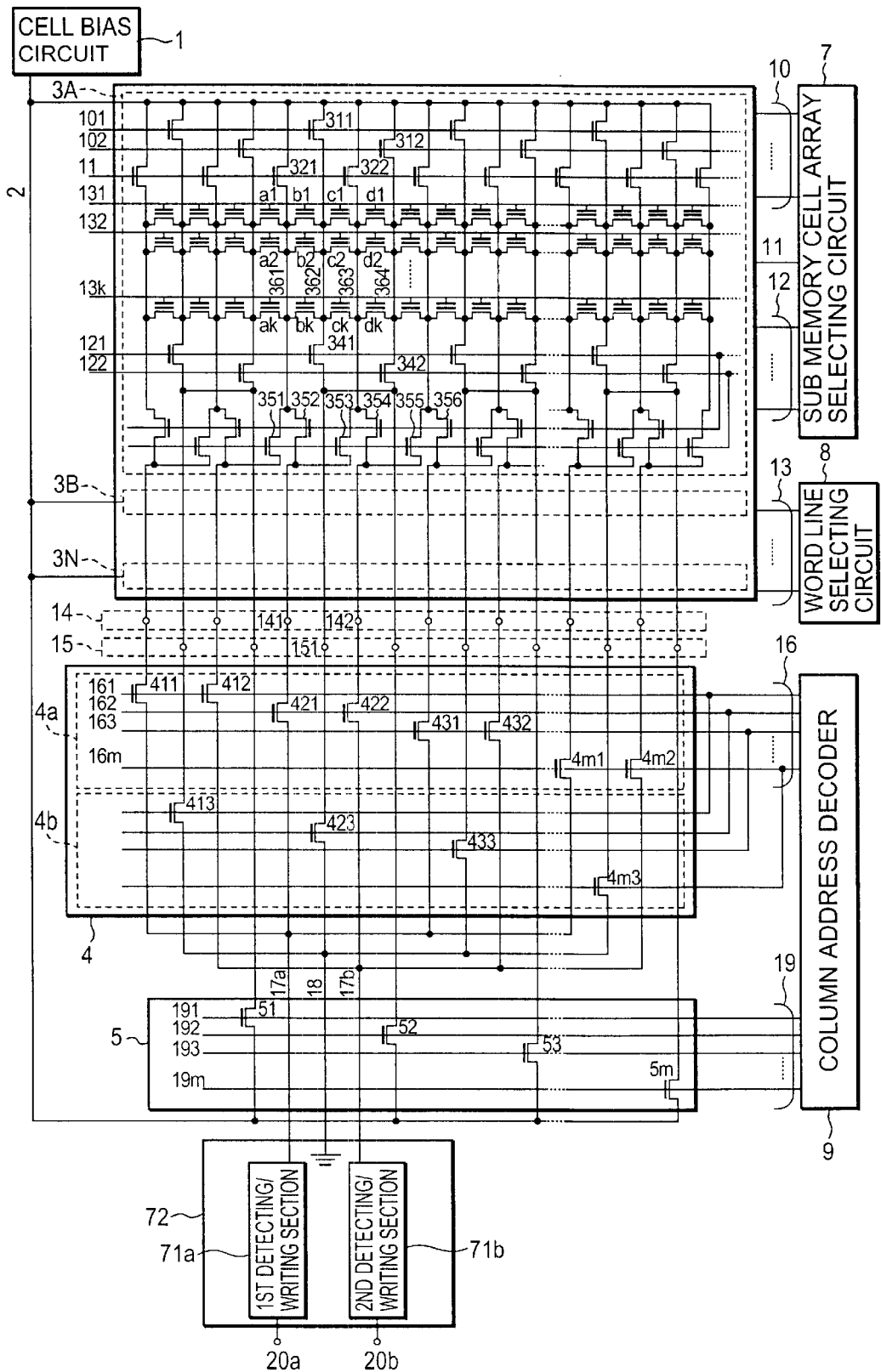
FIG. 14 is a circuit diagram showing the configuration of a nonvolatile semiconductor memory according to a tenth embodiment of the present invention.

As shown in FIG. 14, a nonvolatile semiconductor memory according to a tenth embodiment is different from the nonvolatile semiconductor memory according to the first embodiment in that the detecting circuit 6 has been replaced by a detecting/writing circuit 72, and an electrical data writing function has been added.

In the detecting/writing circuit 72, the first detecting section 6*a* and the second detecting section 6*b* in the detecting circuit 6 have been replaced by a first detecting/writing section 71*a* and a second detecting/writing section 71*b*, respectively. In other words, the detecting/writing circuit 72 is different from the detecting/writing circuit 71 provided in the nonvolatile semiconductor memory according to the ninth embodiment in that the transistor 71*c* has been removed. A node 18 is directly connected to the ground line.

The nonvolatile semiconductor memory according to the tenth embodiment performs substantially the same data reading operation as that of the nonvolatile semiconductor memory according to the first embodiment.

The data writing operation of the nonvolatile semiconductor memory according to the tenth embodiment will be described. In the data writing operation, the relationship in terms of potential between the source and the drain in each memory cell is reversed from that in a data reading operation. In the following description, however, the designations of the circuit elements used so far will be used as they are.

In the data writing operation, a cell bias circuit 1 outputs a non-write voltage Vn to a bias voltage supply line 2. The first detecting/writing section 71*a* and the second detecting/writing section 71*b* that belong to the detecting/writing circuit 72 output a write voltage Vwsg and the non-write voltage Vn to the nodes 17*a* and 17*b*, respectively, according to the data to be written to a selected memory cell.

If a sub memory cell array 3A is not selected, then a sub memory cell array selecting circuit 7 outputs an L-level voltage V1 to sub memory cell array selection lines 121 and 122 connected to the sub memory cell array 3A in a sub memory cell array selection line group 12 so as to set all source selecting transistors 341, 342 and so on and all drain selecting transistors 351, 352 and so on that belong to the sub memory cell array 3A to the OFF state or the non-conducting state in order to disconnect the drain lines 361, 363, and so on of the sub memory cell array 3A from a bit line group 14 and to disconnect the source lines 362, 364, and so on from a main source line group 15.

Furthermore, the sub memory cell array selecting circuit 7 outputs the voltage V1 to the source equalizing selection lines, the drain equalizing selection lines, and sub memory cell array selection lines connected to non-selected sub memory cell arrays other than the sub memory cell array 3A.

A drain equalizing selection line 11, the source equalizing selection lines making up a source equalizing selection line group 10, and the word lines making up a word line group 13 may take arbitrary logic levels.

The descriptions will now be given of the operation performed by the nonvolatile semiconductor memory according to the tenth embodiment to write data to memory cells b2 and c2 belonging to the sub memory cell array 3A.

A word line selecting circuit 8 outputs a gate voltage Vwg to a word line 132 connected to the gates of the memory cells b2 and c2, and also outputs the voltage V1 to word lines 131, 133, ..., and 13*k* other than the word line 132.

At the same time, the sub memory cell array selecting circuit 7 outputs the gate voltage Vwg to the sub memory cell array selection line 121 so as to set the drain selecting transistors 352 and 354 and a source selecting transistor 341 to the ON state or the conducting state. This causes the drain lines 361 and 363 connected to the drains of the memory cells b2 and c2 to be connected to bit lines 141 and 142, and a source line 362 commonly connected to the sources of the memory cells b2 and c2 to be connected to a main source line 151.

The sub memory cell array selecting circuit 7 outputs the L-level voltage V1 to the source equalizing selection line 101 to set a source line equalizing transistor 311 to the OFF state or the non-conducting state so as to disconnect the source line 362 from the bias voltage supply line 2.

Furthermore, the sub memory cell array selecting circuit 7 outputs the H-level voltage Vh to a source equalizing selection line 102 so as to connect the drains of the memory cells a2 and d2 with the bias voltage supply line 2. This causes the non-write voltage Vn to be applied to the drains of the memory cells a2 and d2, thus preventing erroneous writing of data to the memory cells a2 and d2.

The sub memory cell array selecting circuit 7 outputs the L-level voltage V1 to the drain equalizing selection line 11 in order to disconnect drain lines from the bias voltage supply line 2.

A column address decoder 9 outputs a gate voltage Vwg to a column selection line 162 to set a transistor 421 belonging to a bit line column switch group 4*a* and a transistor 423 belonging to a source line column switch group 4*b* to the ON state. This causes the bit line 141 and the node 17*a* to be connected, a bit line 142 and the node 17*b* to be connected, and the main source line 151 and the node 18 to be connected.

At the same time, a column address decoder 9 outputs the voltage V1 to column selection lines 161, 163, ..., and 16*m* other than the column selection line 162 in order to turn OFF the transistors other than the transistor 421 that belong to the bit line column switch group 4a and the transistors other than the transistor 423 that belong to the source line column switch group 4b. This causes the non-selected bit lines other than the selected bit lines 141 and 142 and the non-selected main source lines other than the selected main source line 151 to be isolated from the detecting/writing circuit 71.

Furthermore, the column address decoder 9 outputs the voltage V1 to non-selected column selection lines 191, . . . and 19m to thereby set transistors 51, . . . , 5m constituting a non-selected source line equalizing transistor group 5 to the OFF state or the non-conducting state. This prevents the write voltage Vwsd from being applied to the source lines from the non-selected source line equalizing transistor group 5.

Thus, in the nonvolatile semiconductor memory according to the tenth embodiment, a high voltage is selectively applied to the drain of the memory cell to which data is to be written. With this arrangement, erroneous data writing can be prevented, and the occurrence of a drain disturbance attributable to the application of a high voltage to a drain can be suppressed. The tenth embodiment can be applied to the second embodiment shown in FIG. 5, because only the source line 362 of a write cell in the second embodiment provides the ground potential. The drains of memory cells y2 and z2 connected to a bit line 141 is subjected to a high voltage; however, the sources of the memory cells y2 and z2 are in a floating state, so that no data will be written thereto.

Eleventh Embodiment

Figure 15:
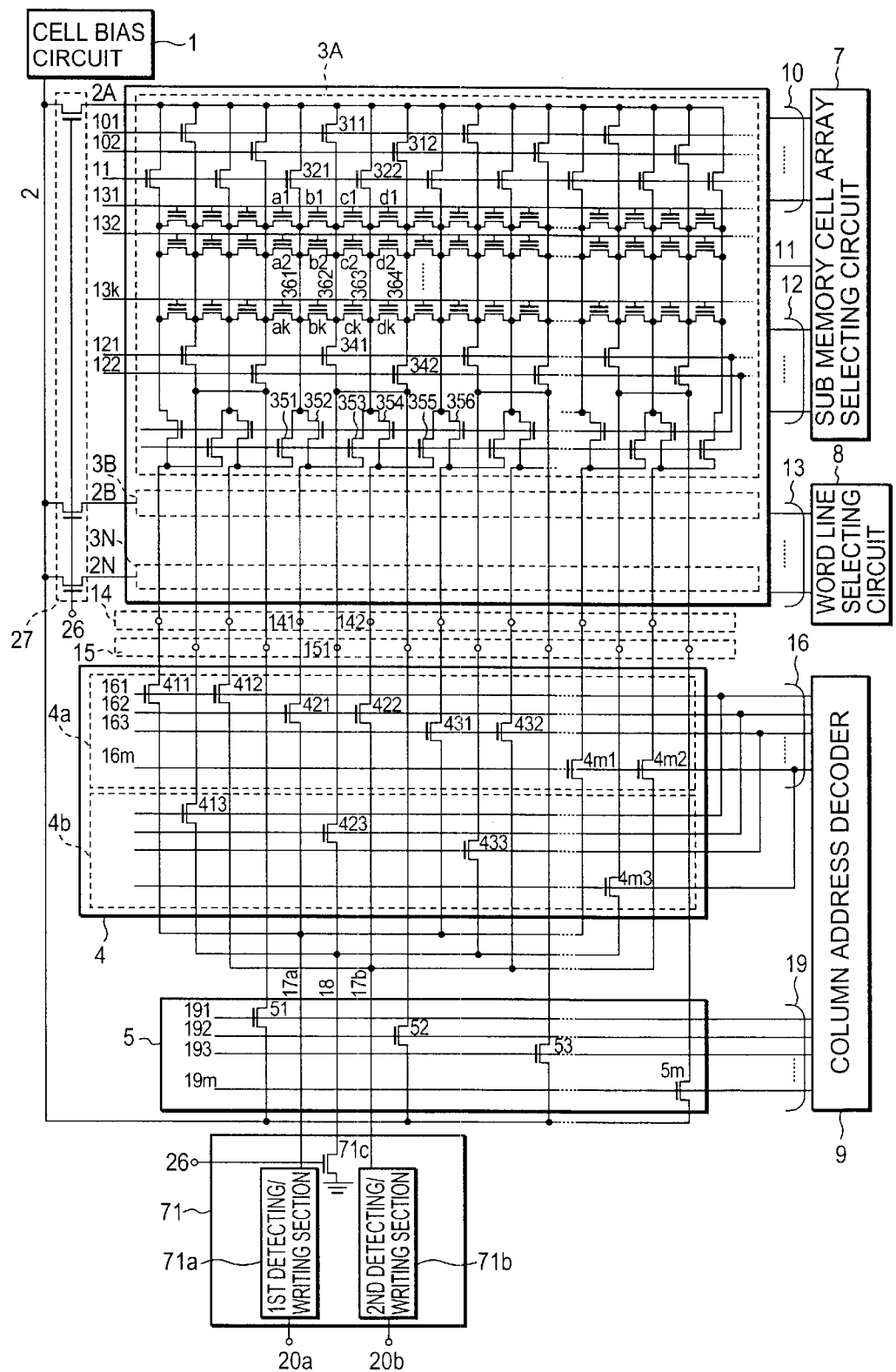
FIG. 15 is a circuit diagram showing the configuration of a nonvolatile semiconductor memory according to an eleventh embodiment of the present invention.
Figure 16:
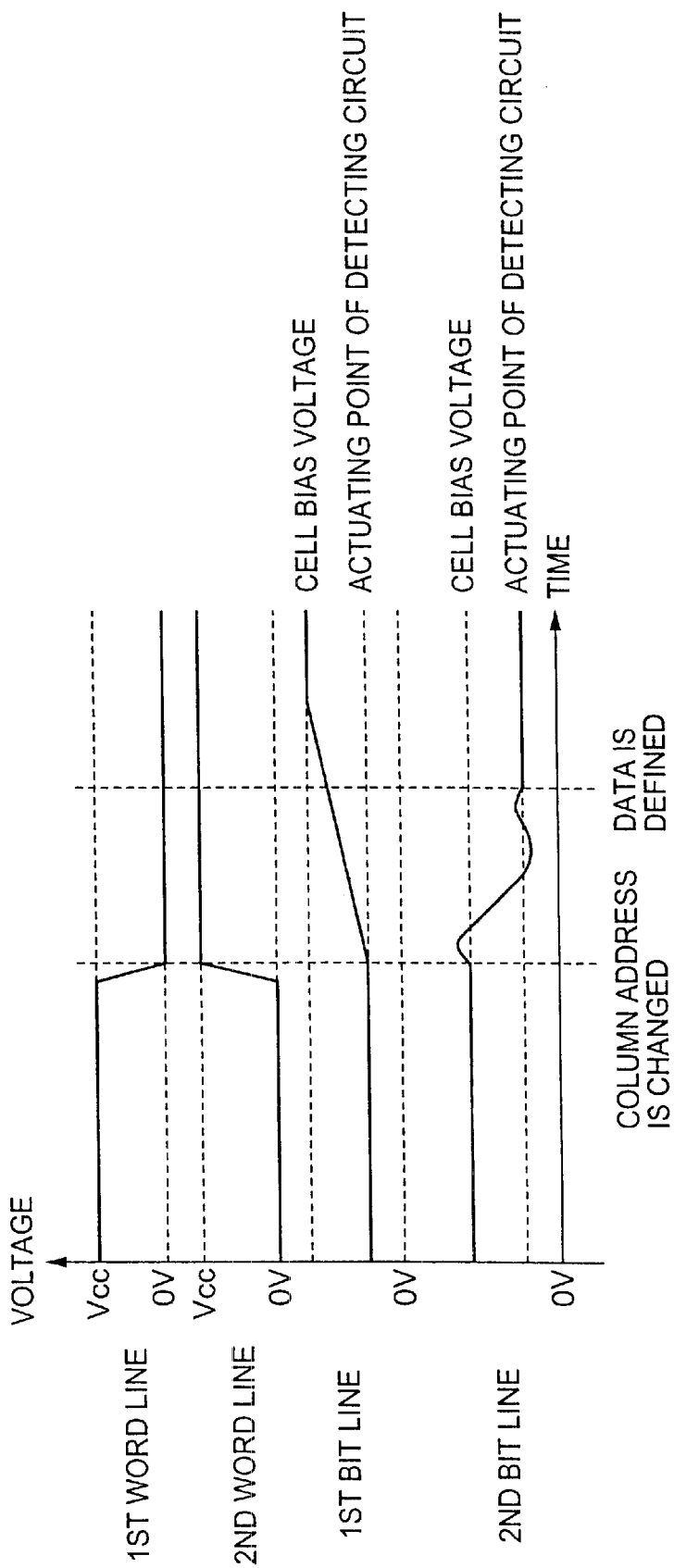
FIG. 16 is a waveform diagram showing changes in voltage during a data reading operation of bit lines provided in a conventional nonvolatile semiconductor memory.

A nonvolatile semiconductor memory according to an eleventh embodiment shown in FIG. 15 is different from the nonvolatile semiconductor memory according to the first embodiment in that the detecting circuit 6 has been replaced by a detecting/writing circuit 71, a cell drain voltage applying transistor group 27 has been added, and an electrical data writing function has been added.

The cell drain voltage applying transistor group 27 is constructed by a plurality of cell drain voltage applying transistors having their gates connected to a control node 27. The drains of the cell drain voltage applying transistors are commonly connected to the bias voltage supply line 2, and the sources of the cell drain voltage applying transistors are respectively connected to sub memory cell arrays 3A through 3N through the intermediary of bias voltage supply sub lines 2A through 2N.

In the detecting/writing circuit 71, the first detecting section 6a and the second detecting section 6b of the detecting circuit 6 have been replaced by a first detecting/writing section 71a and a second detecting/writing section 71b, and an n-channel transistor 71c has been added.

In the nonvolatile semiconductor memory according to the first embodiment, the node 18 is directly connected to the ground line, whereas the node 18 in this embodiment is connected to the ground line via the transistor 71c. The gate of the transistor 71c is connected to a control node 26. When the control node 26 is set at the H-level, the node 18 is set at the ground level.

To read data, an H-level voltage Vh is applied to the control node 26. This turns ON the transistor 71c and all cell drain voltage applying transistors belonging to a cell drain voltage applying transistor group 27. The nonvolatile semiconductor memory according to the eleventh embodiment performs substantially the same data reading operation as that of the nonvolatile semiconductor memory according to the first embodiment.

The data writing operation of the nonvolatile semiconductor memory according to the eleventh embodiment will be described. In the data writing operation, the relationship in terms of potential between the source and the drain in each memory cell is reversed from that in a data reading operation. In the following description, however, the designations of the circuit elements used so far will be used as they are.

In the data writing operation, a cell bias circuit 1 outputs a write voltage Vwsd to be applied to the drain of each memory cell to a bias voltage supply line 2. The first detecting/writing section 71a and the second detecting/writing section 71b that belong to the detecting/writing circuit 71 output a write voltage Vw and a non-write voltage Vn to the nodes 17a and 17b, respectively, according to the data to be written to a selected memory cell.

An L-level voltage V1 is applied to the control node 26. This causes the bias voltage supply line 2 and bias voltage supply sub lines 2A through 2N to be disconnected.

If a sub memory cell array 3A is not selected, then a sub memory cell array selecting circuit 7 outputs the L-level voltage V1 to source equalizing selection lines 101 and 102 connected to the sub memory cell array 3A in a source equalizing selection line group 10, and also outputs the voltage V1 to a drain equalizing selection line 11 so as to prevent any of source lines 362, 364, and so on and drain lines 361, 363, and so on that belong to the sub memory cell array 3A from being connected to the bias voltage supply sub line 2A. Thus, all source line equalizing transistors 311, 312 and so on, and all drain line equalizing transistors 321, 322, 323 and so on, which belong to the sub memory cell array 3A are set to the OFF state or the non-conducting state.

Furthermore, the sub memory cell array selecting circuit 7 outputs the voltage V1 to sub memory cell array selection lines 121 and 122 connected to the sub memory cell array 3A in a sub memory cell array selection line group 12 so as to set all source selecting transistors 341, 342 and so on and all drain selecting transistors 351, 352 and so on that belong to the sub memory cell array 3A to the OFF state or the non-conducting state in order to disconnect the drain lines 361, 363 and so on of the sub memory cell array 3A from a bit line group 14, and to disconnect the source lines 362, 364 and so on from a main source line group 15.

Similarly, the sub memory cell array selecting circuit 7 outputs the voltage V1 to the source equalizing selection lines, the drain equalizing selection lines, and the sub memory cell array selection lines connected to the non-selected sub memory cell arrays other than the sub memory cell array 3A.

The descriptions will be given of the operation performed by the nonvolatile semiconductor memory according to the eleventh embodiment to write data to memory cells b2 and c2 belonging to the sub memory cell array 3A.

A word line selecting circuit 8 outputs a gate voltage Vwg to a word line 132 connected to the gates of the memory cells b2 and c2, and also outputs the voltage V1 to word lines 131, 133, . . . , and 13k other than the word line 132.

At the same time, the sub memory cell array selecting circuit 7 outputs an H-level voltage Vh to the sub memory cell array selection line 121 to set the drain selecting transistors 352 and 354 and a source selecting transistor 341 to the ON state or the conducting state. This causes the drain lines 361 and 363 connected to the drains of the memory cells b2 and c2 to be connected to bit lines 141 and 142, and a source line 362 commonly connected to the sources of the memory cells b2 and c2 to be connected to a main source line 151.

Furthermore, the sub memory cell array selecting circuit 7 outputs the L-level voltage V1 to the source equalizing selection lines 101 and 102 and a drain equalizing selection line 11 so as to disconnect all source lines and bit lines that belong to the sub memory cell array 3A from the bias voltage supply sub line 2A.

A column address decoder 9 outputs a voltage Vh to a column selection line 162 to set a transistor 421 belonging to a bit line column switch group 4a and a transistor 423 belonging to a source line column switch group 4b to the ON state. This causes the bit line 141 and the node 17a to be connected, the bit line 142 and the node 17b to be connected, and the main source line 151 and the node 18 to be connected.

At the same time, a column address decoder 9 outputs the voltage V1 to column selection lines 161, 163, . . . , and 16m other than the column selection line 162 in order to turn OFF the transistors other than the transistor 421 that belong to the bit line column switch group 4a and the transistors other than the transistor 423 that belong to the source line column switch group 4b. This causes the non-selected bit lines other than the selected bit lines 141 and 142 and the non-selected main source lines other than the selected main source line 151 to be isolated from the detecting/writing circuit 71.

Furthermore, the column address decoder 9 outputs the gate voltage Vwg to a non-selected column line 192 so as to apply the write voltage Vwsd to the selected main source line 151. This sets only a transistor 52 among a plurality of transistors making up a non-selected source line equalizing transistor group 5 to the ON state or the conducting state. This, in turn, sets the transistor 341 to the conducting state, so that the voltage Vwsd to be applied to a source line 362. At the same time, the column address decoder 9 outputs the L-level voltage V1 to non-selected column lines 191, 193, . . . , 19m other than the non-selected column line 192 thereby to prevent the write voltage Vwsd from being applied to main source lines 152, 153, . . . , 15m other than the selected main source line 151. This sets transistors 51, 53, . . . , 5m other than the transistor 52 to the OFF state or the non-conducting state among the plural transistors making up the non-selected source line equalizing transistor group 5.

During the writing operation, the voltage V1 is applied to a control node 26 to set the transistor 71c to the OFF state or the non-conducting state in order to prevent a short circuit between the bias voltage supply line 2 and the ground line through the source line 362.

Thus, in the nonvolatile semiconductor memory according to the eleventh embodiment, a high voltage is selectively applied to the drain of the memory cell to which data is to be written, as in the case of the nonvolatile semiconductor memory according to the tenth embodiment. With this arrangement, erroneous data writing can be prevented, and the occurrence of a drain disturbance attributable to the application of a high voltage to a drain can be suppressed. As in the case of the tenth embodiment, the eleventh embodiment can also be applied to the second embodiment shown in FIG. 5.

The preferred embodiments have been described with reference to the accompanying drawings; however, the present invention is not limited to the embodiments. Various modifications of the disclosed embodiments will become apparent to persons skilled in the art upon reference to the description of the invention. It is therefore contemplated that the appended claims will cover any modifications or embodiments as fall within the true scope of the invention.

For example, the embodiments in accordance with the present invention have been described by referring to the nonvolatile semiconductor memory equipped with one stage of column switches (the bit line column switch group 4a and the source line column switch group 4b). The present invention, however, can also be applied to a nonvolatile semiconductor memory equipped with two stages or more of column switches.

In the cell bias circuit 1, 81, 82, or 85 provided in the nonvolatile semiconductor memories according to the embodiments of the present invention, the transistor Tr11 has its gate connected to its drain so that it functions as a diode. Alternatively, however, the gate may be connected to a ground line.

For instance, as shown in FIG. 7, the nonvolatile semiconductor memory according to the fourth embodiment is provided with the cell bias circuit 81 that includes the current mirror circuit, and the first and second detecting sections 76a and 76b, respectively. The current mirror circuit is characterized by the commonality of the gates of the two p-channel transistors, and the gates of the two n-channel transistors that provide the input nodes of the current mirror circuit. As an alternative, it is possible to employ a current mirror circuit characterized by the commonality of the gates of two n-channel transistors, and the gates of two p-channel transistors that provide the input nodes.

As shown in FIG. 11, the operation-mode cell bias voltage retaining circuit 86 provided in the nonvolatile semiconductor memory according to the seventh embodiment is equipped with the transistor Tr861 between the power line and the transistor Tr11 to cut off the current path from the power line to the bias voltage supply line 2, and the transistors Tr862 and Tr863 are provided between the power line and the transistor Tr13 and between the power line and the transistor Tr811, respectively, to cut off the current path from the power line to the ground line. It is alternatively possible, however, to change the locations of the transistors, namely, to position the transistors Tr861, Tr862, and Tr863 between the transistor Tr11 and the transistor Tr12, between the transistor Tr13 and the node N11, and between the transistor Tr811 and the node N811.

As shown in FIG. 11, the first detecting section 78a provided in the nonvolatile semiconductor memory according to the seventh embodiment is equipped with the transistor Tr781 between the power line and the transistor Tr61 to cut off the current path from the power line to the node 17a, and the transistor Tr782 and the transistor Tr783 are provided between the power line and the transistor Tr63 and between the power line and the transistor Tr761, respectively, to cut off the current path from the power line to the ground line. It is alternatively possible, however, to change the locations of the transistors, namely, to position the transistors Tr781, Tr782, and Tr783 between the transistor Tr61 and the transistor Tr62, between the transistor Tr63 and the node N65, and between the transistor Tr761 and the node N761.

As described above, the nonvolatile semiconductor memory circuit in accordance with the present invention permits faster data reading. The present invention can also be applied to a nonvolatile semiconductor device equipped with an electrical data writing function. Moreover, the present invention makes it possible to reduce the size and the power consumption of the device.

What is claimed is:

1. A nonvolatile semiconductor memory comprising:

a cell bias circuit supplying a first voltage;

a memory cell array having a plurality of memory cell transistors, a plurality of word lines, a plurality of drain lines disposed perpendicular to the word lines and a plurality of source lines disposed perpendicular to the word lines;

a plurality of source line equalizing transistors connected between said cell bias circuit and the source lines, respectively, said source line equalizing transistors turning on during a stand by mode;

a plurality of drain line equalizing transistors connected between said cell bias circuit and the drain lines, respectively, said drain line equalizing transistors turning on during the stand by mode;

a plurality of bit lines;

a plurality of main source lines;

a plurality of source line selecting transistors connected between said main source lines and the source lines, respectively, said source line selecting transistors turning off during the stand by mode;

a plurality of drain line selecting transistors connected between said bit lines and the drain lines, respectively, said drain line selecting transistors turning off during the stand by mode;

a detecting circuit connected to said bit lines for supplying the first voltage to said bit lines for detecting data stored in the memory cells.

2. A nonvolatile semiconductor memory according to claim 1, wherein said cell bias circuit and said detecting circuit have substantially the same circuit structure.

3. A nonvolatile semiconductor memory according to claim 1, wherein a second voltage is applied to said main source lines.

4. A nonvolatile semiconductor memory according to claim 1, further comprising a memory array selection circuit for outputting control signals to said source line equalizing transistors, drain line equalizing transistors, source line selecting transistors and drain line selecting transistors.

5. A nonvolatile semiconductor memory according to claim 1, wherein said cell bias circuit is connected to said detecting circuit.

6. A nonvolatile semiconductor memory according to claim 1, further comprising a reference voltage circuit connected to said cell bias circuit and said detecting circuit for supplying a reference voltage.

7. A nonvolatile semiconductor memory having a plurality of memory cell arrays, each of the memory cell arrays comprising:

a cell bias circuit supplying a first voltage;

a memory cell array having a plurality of memory cell transistors, a plurality of word lines, a plurality of drain lines disposed perpendicular to the word lines and a plurality of source lines disposed perpendicular to the word lines;

a plurality of source line equalizing transistors connected between said cell bias circuit and the source lines, respectively, said source line equalizing transistors turning on when the memory cell is not selected;

a plurality of drain line equalizing transistors connected between said cell bias circuit and the drain lines, respectively, said drain line equalizing transistors turning on when the memory cell is not selected;

a plurality of bit lines;

a plurality of main source lines;

a plurality of source line selecting transistors connected between said main source lines and the source lines, respectively, said source line selecting transistors turning off when the memory cell is not selected;

a plurality of drain line selecting transistors connected between said bit lines and the drain lines, respectively, said drain line selecting transistors turning off when the memory cell is not selected;

a detecting circuit connected to said bit lines for supplying the first voltage to said bit lines for detecting data stored in the memory cells.

8. A nonvolatile semiconductor memory according to claim 7, wherein said cell bias circuit and said detecting circuit have substantially the same circuit structure.

9. A nonvolatile semiconductor memory according to claim 7, wherein a second voltage is applied to said main source lines.

10. A nonvolatile semiconductor memory according to claim 7, further comprising a memory array selection circuit for outputting control signals to said source line equalizing transistors, drain line equalizing transistors, source line selecting transistors and drain line selecting transistors.

11. A nonvolatile semiconductor memory according to claim 7, wherein said cell bias circuit is connected to said detecting circuit.

12. A nonvolatile semiconductor memory according to claim 7, further comprising a reference voltage circuit connected to said cell bias circuit and said detecting circuit for supplying a reference voltage.

* * * * *